(12) United States Patent
Lukas et al.

(10) Patent No.: US 7,932,188 B2
(45) Date of Patent: Apr. 26, 2011

(54) MECHANICAL ENHANCEMENT OF DENSE AND POROUS ORGANOSILICATE MATERIALS BY UV EXPOSURE

(75) Inventors: Aaron Scott Lukas, Washington, DC (US); Mark Leonard O'Neill, Allentown, PA (US); Jean Louise Vincent, Bethlehem, PA (US); Raymond Nicholas Vrtis, Orefield, PA (US); Mark Daniel Bitner, Nazareth, PA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 57 days.

(21) Appl. No.: 12/262,879

(22) Filed: Oct. 31, 2008

(65) Prior Publication Data

US 2009/0054674 A1    Feb. 26, 2009

Related U.S. Application Data

(60) Division of application No. 10/624,357, filed on Jul. 21, 2003, now Pat. No. 7,468,290, which is a continuation-in-part of application No. 10/379,466, filed on Mar. 4, 2003, now Pat. No. 7,098,149.

(51) Int. Cl.
*H01L 21/31* (2006.01)
(52) U.S. Cl. ............ 438/780; 438/99; 438/795; 257/40; 257/E51.012; 501/39; 501/80
(58) Field of Classification Search .......... 438/99, 438/780, 795; 257/40, E51.012; 427/255.28, 427/553, 569; 501/39, 80; 556/450, 482
See application file for complete search history.

(56) References Cited

U.S. PATENT DOCUMENTS

| | | | |
|---|---|---|---|
| 4,603,168 A | 7/1986 | Sasaki et al. | |
| 5,609,925 A | 3/1997 | Camilletti et al. | |
| 5,935,646 A | 8/1999 | Raman et al. | |
| 5,970,384 A | 10/1999 | Yamazaki et al. | |
| 6,017,806 A | 1/2000 | Harvey | |
| 6,042,994 A | 3/2000 | Yang et al. | |
| 6,168,980 B1 | 1/2001 | Yamazaki et al. | |

(Continued)

FOREIGN PATENT DOCUMENTS

CN    1458947 A    3/2006

(Continued)

OTHER PUBLICATIONS

Dixit, Girish, et al., "Film Properties and Integration Performance of a Nano-Porous Carbon Doped Oxide", Applied Materials, Inc, Santa Clara, California, USA, International Interconnect Technology Conference, Jun. 2004.

(Continued)

*Primary Examiner* — Matthew C Landau
*Assistant Examiner* — Colleen E Snow
(74) *Attorney, Agent, or Firm* — Joseph D. Rossi

(57) ABSTRACT

Low dielectric materials and films comprising same have been identified for improved performance when used as interlevel dielectrics in integrated circuits as well as methods for making same. In one aspect of the present invention, an organosilicate glass film is exposed to an ultraviolet light source wherein the film after exposure has an at least 10% or greater improvement in its mechanical properties (i.e., material hardness and elastic modulus) compared to the as-deposited film.

19 Claims, 13 Drawing Sheets

U.S. PATENT DOCUMENTS

| | | | |
|---|---|---|---|
| 6,231,989 B1 | 5/2001 | Chung et al. | |
| 6,284,050 B1 | 9/2001 | Shi et al. | |
| 6,426,236 B1 | 7/2002 | Ishizaka et al. | |
| 6,472,076 B1 | 10/2002 | Hacker | |
| 6,495,479 B1 | 12/2002 | Wu et al. | |
| 6,566,278 B1 | 5/2003 | Harvey et al. | |
| 6,613,834 B2* | 9/2003 | Nakata et al. | 524/588 |
| 6,913,796 B2* | 7/2005 | Albano et al. | 427/536 |
| 7,041,748 B2 | 5/2006 | Lin et al. | |
| 7,358,316 B2 | 4/2008 | Ko et al. | |
| 2001/0038919 A1 | 11/2001 | Berry, III et al. | |
| 2001/0055891 A1 | 12/2001 | Ko et al. | |
| 2002/0102413 A1 | 8/2002 | Han et al. | |
| 2002/0106500 A1 | 8/2002 | Albano et al. | |
| 2002/0132496 A1 | 9/2002 | Ball et al. | |
| 2002/0142585 A1 | 10/2002 | Mandal | |
| 2003/0003288 A1 | 1/2003 | Nakata et al. | |
| 2003/0032300 A1 | 2/2003 | Waldfried et al. | |
| 2003/0054115 A1 | 3/2003 | Albano et al. | |
| 2003/0087042 A1 | 5/2003 | Murakami et al. | |
| 2003/0151031 A1 | 8/2003 | Li et al. | |
| 2003/0162034 A1 | 8/2003 | O'Neill et al. | |
| 2003/0198742 A1 | 10/2003 | Vrtis et al. | |
| 2003/0224622 A1 | 12/2003 | Matsuki et al. | |
| 2003/0232137 A1 | 12/2003 | Vrtis et al. | |
| 2004/0096593 A1 | 5/2004 | Lukas et al. | |
| 2004/0096672 A1 | 5/2004 | Lukas et al. | |
| 2005/0048795 A1 | 3/2005 | Ko et al. | |

FOREIGN PATENT DOCUMENTS

| | | |
|---|---|---|
| EP | 0 537 364 A1 | 4/1993 |
| EP | 0 575 650 A1 | 12/1993 |
| EP | 1 122 333 A2 | 8/2001 |
| EP | 1122333 A2 | 8/2001 |
| EP | 1 225 194 A2 | 7/2002 |
| EP | 1 354 980 A1 | 10/2003 |
| EP | 1482550 | 1/2004 |
| EP | 1 420 439 A2 | 5/2004 |
| EP | 1 464 726 A2 | 10/2004 |
| JP | 59124729 | 7/1984 |
| JP | 200351283 A | 2/2003 |
| TW | 540118 | 3/1990 |
| WO | 9700535 A1 | 1/1997 |
| WO | 0129052 A1 | 4/2001 |
| WO | 0161737 A1 | 8/2001 |
| WO | 02065534 A1 | 8/2002 |
| WO | 03025993 A1 | 3/2003 |
| WO | 03025994 A1 | 3/2003 |
| WO | 2004083495 A2 | 9/2004 |
| WO | 2005019303 A1 | 3/2005 |

OTHER PUBLICATIONS

E. G. Parada, et al., "Improvement of Silicon Oxide Film Properties by Ultraviolet Excimer Lamp Annealing," Applied Surface Science 86, pp. 294-298 (1995).

A. Guo, et al., "Highly Active Visible-Light Photocatalysts for Curing a Ceramic Precursor," Chem Mater. 10, pp. 531-536 (1998).

T. Clark, Jr., et al., "A New Application of UV-Ozone Treatment in the Preparation of Substrate-Supported, Mesoporous Thin Films," Chem. Mater. 12, pp. 3879-3884 (2000).

M. Brinkmann, et al., "Room-Temperature Synthesis of a-SiO2 Thin Films by UV-Assisted Ozonolysis of a Polymer Precursor," Chem. Mater. 13, pp. 967-972 (2001).

A. Hozumi, et al., "Low-Temperature Elimination of Organic Components from Mesostructured Organic-Inorganic Composite Films Using Vacuum Ultraviolet Light," Chem. Mater. 12, pp. 3842-3847 (2007).

M. Ouyang, et al., "Conversion of Some Siloxane Polymers to Silicon Oxide by UV/Ozone Photochemical Processes," Chem. Mater. 12, pp. 1591-1596 (2000).

Q. Han, et al., "Ultra Low-k Porous Silicon Dioxide Films from a Plasma Process," IEEE (2001), pp. 171-173.

C. Waldfried, et al., "Single Wafer RapidCuring TM of Porous Low-k Materials," IEEE (2002), pp. 226-228.

Yokotani, A., et al; "A Single Precursor Photlitic Chemical Vapor Deposition of Silican Film Using a Dielectric Barier Discharge Xenon Excimer Lamp"; Applied Physics Letters, AIP, American Institute of Physics, Melville, NY; vol. 69, No. 10; Sep. 2, 1996; pp. 1399-1401; XP012016011.

Ykotani, A., et al; "A Single Precursor Photolitic Chemical Vapor Deposition of Silica Film Using a Dielectric Barier Discharge Xenon Excimer Lamp"; Applied Physics Letters, AIP, American Institute of Physics, Melville, NY, US; vol. 69, No. 10; Sep. 2, 1996; pp. 1399-1401; XP012016011.

Grill, A. et al; "Ultralow-K Dielectrics Prepared by Plasma-Enhanced Chemical Vapor Deposition"; Applied Physics Letters, AIP, American Institute of Physics, Melville, NY, US; vol. 79, No. 6; Aug. 6, 2001; pp. 803-805; XP012029992.

Wu, Z-C., et al; "Physical and Electrical Charcteristics of Methylsilane- and Trimethylsilane-Doped Low Dielectric Constant Chemical Vapor Deposited Oxides"; Journal of the Electrochemical Society, Electrochemical Society. Manchester, New Hampshire, US; vol. 148, No. 6; Jun. 1, 2001; pp. F127-F132; XP001058314.

* cited by examiner

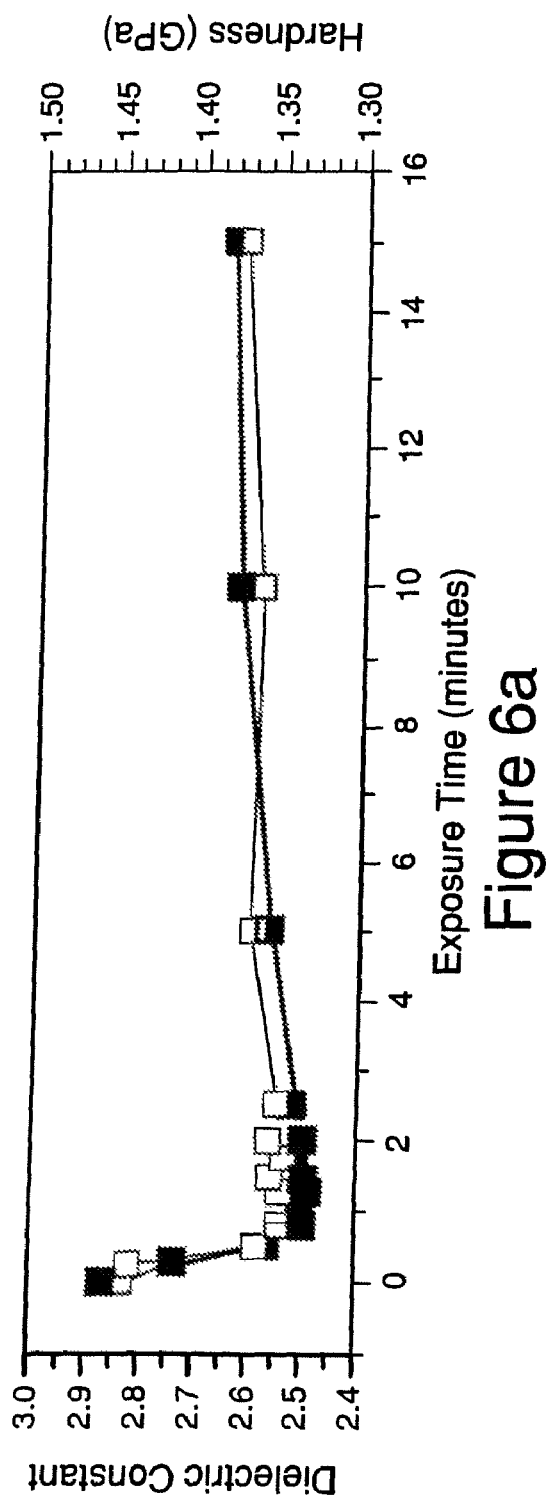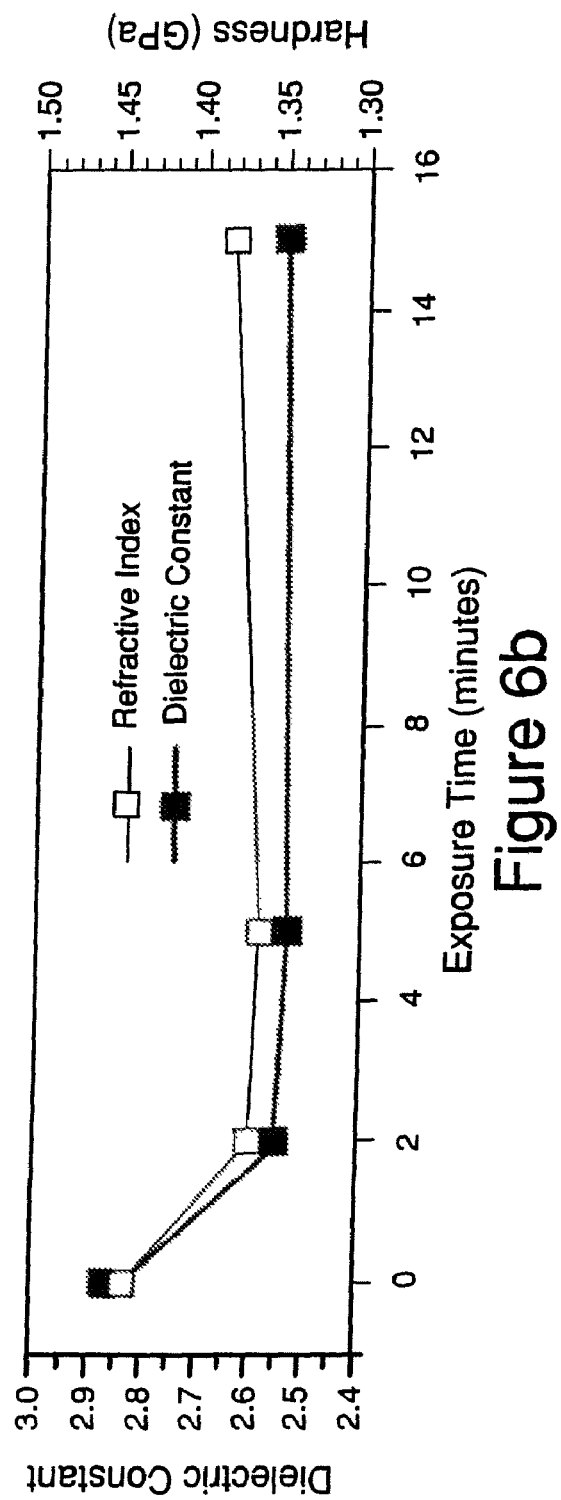
Figure 6a
Figure 6b

MECHANICAL ENHANCEMENT OF DENSE AND POROUS ORGANOSILICATE MATERIALS BY UV EXPOSURE

CROSS-REFERENCE TO RELATED APPLICATIONS

This application is a divisional application of U.S. application Ser. No. 10/624,357, filed Jul. 21, 2003, which is a continuation-in-part of U.S. patent application Ser. No. 10/379,466, filed Mar. 4, 2003, now U.S. Pat. No. 7,098,149, the disclosures of which are incorporated herein by reference in their entirety.

BACKGROUND OF THE INVENTION

The present invention relates generally to the formation of dielectric films. More specifically, the invention relates to dielectric materials and films comprising same having a low dielectric constant and enhanced mechanical properties and methods for making same.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitive crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials are desirable for use, for example, as premetal dielectric layers or interlevel dielectric layers.

A number of processes have been used for preparing low dielectric constant films. Chemical vapor deposition (CVD) and spin-on dielectric (SOD) processes are typically used to prepare thin films of insulating layers. Other hybrid processes are also known such as CVD of liquid polymer precursors and transport polymerization CVD. A wide variety of low κ materials deposited by these techniques have been generally classified in categories such as purely inorganic materials, ceramic materials, silica-based materials, purely organic materials, or inorganic-organic hybrids. Likewise, a variety of processes have been used for curing these materials to, for example, decompose and/or remove volatile components and substantially crosslink the films, such as heating, treating the materials with plasmas, electron beams, or UV radiation.

The industry has attempted to produce silica-based materials with lower dielectric constants by incorporating organics or other materials within the silicate lattice. Undoped silica glass ($SiO_2$), referred to herein as "USG", exhibits a dielectric constant of approximately 4.0. However, the dielectric constant of silica glass can be lowered to a value ranging from 2.7 to 3.5 by incorporating terminal groups such as fluorine or methyl into the silicate lattice. These materials are typically deposited as dense films and integrated within the IC device using process steps similar to those for forming USG films.

An alternative approach to reducing the dielectric constant of a material may be to introduce porosity, i.e., reducing the density of the material. A dielectric film when made porous may exhibit lower dielectric constants compared to a relatively denser film. Porosity has been introduced in low dielectric materials through a variety of different means. For example, porosity may be introduced by decomposing part of the film resulting in a film having pores and a lower density. Additional fabrication steps may be required for producing porous films that ultimately add both time and energy to the fabrication process. Minimizing the time and energy required for fabrication of these films is desirable; thus discovering materials that can be processed easily, or alternative processes that minimize processing time, is highly advantageous.

The dielectric constant (κ) of a material generally cannot be reduced without a subsequent reduction in the mechanical properties, i.e., elastic modulus (Young's modulus), hardness, toughness, of the material. Mechanical strength is needed for subsequent processing steps such as etching, CMP ("Chemical Mechanical Planarization"), and depositing additional layers such as diffusion barriers for copper, copper metal ("Cu"), and cap layers on the product. Mechanical integrity, or stiffness, compressive, and shear strengths, may be particularly important to survive CMP. It has been found that the ability to survive CMP may be correlated with the elastic modulus of the material, along with other factors including polishing parameters such as the down force and platen speed. See, for example, Wang et al., "Advanced processing: CMP of CU/low-κ and Cu/ultralow-κ layers", Solid State Technology, September, 2001; Lin et al., "Low-k Dielectrics Characterization for Damascene Integration", International Interconnect Technology Conference, Burlingame, Calif., June, 2001. These mechanical properties are also important in the packaging of the final product. Because of the trade-off in mechanical properties, it may be impractical to use certain porous low dielectric compositions.

Besides mechanical properties, an additional concern in the production of a low dielectric film may be the overall thermal budget for manufacture of the IC device. The method used extensively in the literature for cross-linking a low dielectric film and/or introducing porosity into a film is thermal annealing. In the annealing step, or a curing step, the film is typically heated to decompose and/or remove volatile components and substantially cross-link the film. Unfortunately, due to thermal budget concerns, various components of IC devices such as Cu metal lines can only be subjected to processing temperatures for short time periods before their performance deteriorates due to undesirable diffusion processes. Additional heating and cooling steps also can significantly increase the overall manufacturing time for the device, thereby lowering the throughput.

An alternative to the thermal anneal or curing step is the use of ultraviolet ("UV") light in combination with an oxygen-containing atmosphere to create pores within the material and lower the dielectric constant. The references, Hozumi, A. et al. "Low Temperature Elimination of Organic Components from Mesostructured Organic-Inorganic Composite Films Using Vacuum Ultraviolet Light", Chem. Mater. 2000 Vol. 12, pp. 3842-47 ("Hozumi I") and Hozumi, A et al., "Micropatterned Silica Films with Ordered Nanopores Fabricated through Photocalcination", NanoLetters 2001, 1(8), pp. 395-399 ("Hozumi II"), describe removing a cetyltrimethylammonium chloride (CTAC) pore-former from a tetraethoxysilane (TEOS) film using ultraviolet ("VUV") light (172 nm) in the presence of oxygen. The reference, Ouyang, M., "Conversion of Some Siloxane Polymers to Silicon Oxide by UV/Ozone Photochemical Processes", Chem. Mater. 2000, 12(6), pp. 1591-96, describes using UV light ranging from 185 to 254 nm to generate ozone in situ to oxidize carbon side groups within poly(siloxane) films and form a $SiO_2$ film. The reference, Clark, T., et al., "A New Preparation of UV-Ozone Treatment in the Preparation of Substrate-Supported Mesoporous Thin Films", Chem. Mater. 2000, 12(12), pp. 3879-3884, describes using UV light with a wavelength below 245.4 nm to produce ozone and atomic oxygen to remove organic species within a TEOS film. These techniques, unfortunately, may damage the resultant film by chemically modifying the bonds that remain within the material. For example, exposure of these materials to an oxidizing atmosphere can result in the oxidation of the C atoms contained therein which has an adverse effect on the dielectric properties of the material.

U.S. Pat. No. 4,603,168 describes cross-linking an alkenylorganopolysiloxane or organohydrosiloxane film by exposure to UV light or electron beam radiation in the presence of heat. The film further includes a dopant such as a photosensitizer like benzophenone or a platinum catalyst that is present in small concentrations to initiate and catalyze the cross-linking. Likewise, the reference Guo, et al., "Highly Active Visible-light Photocatalysts for Curing Ceramic Precursor", Chem. Mater. 1998, 10(2), pp. 531-36, describes using a platinum bis(beta-diketonate) catalyst to cross-link oligo(methylsilylene)methylene and tetravinylsinlane using UV/visible light. The presence of metal catalysts and chromophores would be unsuitable in dielectric films.

U.S. Pat. No. 6,284,500 describes using UV light in the 230 to 350 nm wavelength range to photoinitiate cross-linking within an organic polymer film formed by CVD or an organosilsiquoxane film formed by spin-on deposition to improve the adhesion and mechanical properties of the film. The '500 patent teaches that a thermal annealing step may be used to stabilize the cross-linked film.

Published U.S. patent application No. 2003/054115 (the '115 application) teaches UV curing a porous dielectric material produced by CVD or spin-on deposition methods to produce a UV-cured porous dielectric material having an improved modulus and comparable dielectric constant. The '115 application demonstrates that UV exposure in an $O_2$ atmosphere is more effective than UV exposure in a $N_2$ atmosphere. However, the '115 application also teaches that the UV cure can generate a notable amount of polar species in the porous dielectric materials. Further, the '115 application states that "in all cases a subsequent or possibly concomitant anneal step is necessary in order to remove the Si—OH bonds which are typically generated during the UV curing process."

U.S. Pat. No. 6,566,278 teaches densifying a carbon-doped, silicon oxide ($SiC_xO_y$) film by exposing the film to UV radiation. The carbon-doped silicon oxide film is deposited via chemical vapor deposition of an oxygen-supplying gas and an organosilane silicon supplying gas. The film is then exposed to UV radiation generated from an excited gas species such as xenon, mercury, deuterium, or $KrCl_2$.

U.S. Pat. Nos. 5,970,384 and 6,168,980 describe exposing a PVD or CVD deposited oxide gate layer to UV light in the presence of N2O, NH3, or N2H4 at temperatures between 300 and 700° C. The methods described in both the '384 and '980 patents reduce the C and H impurities within the oxide gate layer and introduce nitrogen near the boundary of the material with the silicon substrate.

Accordingly, there is a need in the art to provide improved dielectric materials having low dielectric constant and sufficient mechanical strength and a method and mixture for making same. Due to thermal budget concerns, there is an additional need for a low temperature treatment for the production low dielectric constant materials for integrated circuits.

All references cited herein are incorporated herein by reference in their entirety.

BRIEF SUMMARY OF THE INVENTION

The present invention satisfies one, if not all, of the needs of the art by providing a process for improving the mechanical properties of an organosilicate glass film. Specifically, in one aspect of the present invention, there is provided a process for improving the material hardness and elastic modulus of an organosilicate film comprising: to provide the organosilicate film having a first material hardness and a first elastic modulus; and exposing the organosilicate film to an ultraviolet radiation source within a non-oxidizing atmosphere to provide the organosilicate film having a second material hardness and a second elastic modulus wherein the second material hardness and the second elastic modulus are at least 10% higher than the first material hardness and the first elastic modulus.

In another aspect of the present invention, there is provided a chemical vapor deposition process for making an organosilicate glass film having the formula $Si_vO_wC_xH_yF_z$ where v+w+x+y+z=100%, v is from 10 to 35 atomic %, w is from 10 to 65 atomic %, x is from 5 to 30 atomic %, y is from 10 to 50 atomic %, and z is from 0 to 15 atomic % comprising: providing a substrate within a vacuum chamber; introducing at least one chemical reagent comprising a structure-former precursor selected from the group consisting of an organosilane and an organosiloxane and a pore-former precursor into the vacuum chamber; applying energy to the at least one chemical reagent in the vacuum chamber to induce reaction of the reagent to deposit an organosilicate film on at least a portion of the substrate; and exposing the organosilicate film to an ultraviolet light source within a non-oxidizing atmosphere wherein the material hardness and the elastic modulus of the organosilicate material after the exposing step are higher than the material hardness and the elastic modulus of the organosilicate material before the exposing step and wherein the organosilicate material is substantially free of Si—OH bonds.

In yet another aspect of the present invention, there is provided a mixture for depositing an organosilicate film, the mixture comprising at least one structure-former precursor selected from the group consisting of an organosilane and an organosiloxane wherein the at least one structure-former precursor and/or the organosilicate film exhibits an absorbance in the 200 to 400 wavelength range.

In an additional aspect of the present invention, there is provided a mixture for depositing an organosilicate film comprising from 5 to 95% of a structure-former precursor selected from the group consisting of an organosilane and an organosiloxane and from 5 to 95% of a pore-former precursor wherein at least one of the precursors and/or the organosilicate film exhibits an absorbance in the 200 to 400 nm wavelength range.

In a still further aspect of the present invention, there is provided a process for preparing a porous organosilicate film having a dielectric constant of 2.7 or less comprising: forming a composite film comprising a structure-former material and a pore-former material wherein the composite film has a first dielectric constant, a first hardness, and a first material modulus; and exposing the composite film to at least one ultraviolet light source within a non-oxidizing atmosphere to remove at least a portion of the pore-former material contained therein and provide the porous organosilicate film wherein the porous organosilicate film has a second dielectric constant, a second hardness, and a second material modulus and wherein the second dielectric constant is at least 5% less than the first dielectric constant, the second modulus is at least 10% greater than the first modulus, and the second hardness is at least 10% greater than that of the first hardness.

These and other aspects of the invention will become apparent from the following detailed description.

BRIEF DESCRIPTION OF SEVERAL VIEWS OF THE DRAWINGS

FIGS. 6a and 6b provides the dielectric constant and refractive index versus UV exposure time for films deposited using a DEMS structure-former precursor and an ATRP pore-former precursor under vacuum atmosphere (5 millitorr) and under nitrogen atmosphere, respectively.

DETAILED DESCRIPTION OF THE INVENTION

Figure 1A:
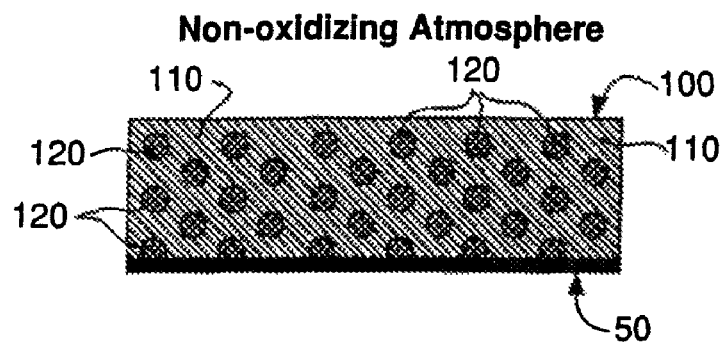
FIGS. 1a through 1c provides an illustration of the various steps of one embodiment of the present invention wherein the exposure to an UV radiation energy source results in the formation of pores within the film.

The present invention is directed towards the preparation of a dense or a porous organosilicate (OSG) glass material and film having a low dielectric constant but sufficient mechanical properties to make the film suitable for use, for example, as an interlayer dielectric in integrated circuits. The organosilicate glass film of the present invention is deposited via chemical vapor deposition of at least one structure-former precursor from the group consisting of an organosilane or an organosiloxane. The deposited organosilicate film is then exposed to an ultraviolet (UV) radiation source to improve the mechanical properties, i.e., material hardness and elastic modulus (Young's modulus) of the as-deposited film while substantially maintaining the dielectric constant of the material. In embodiments wherein the organosilicate film is deposited via chemical vapor deposition of a structure-former and a pore-former precursor to provide a porous organosilicate film, the mechanical properties of the porous organosilicate film are improved after UV exposure while the dielectric constant is reduced. Unlike other processes, the UV exposure step may, in some instances, obviate the need for a thermal annealing.

While not intending to be bound by theory, it is believed that the as-deposited organosilicate films formed by chemical vapor deposition contain lattice imperfections such as, for example, dangling groups that are not incorporated into the film network. In other organosilicate films, these lattice imperfections may be hydrogen bonded to the silica framework as Si—H. In these films, the Si—H bonds are generally not broken until the material is heated to approximately 525° C., which exceeds the temperature range in which organosilicate films can typically be exposed to (i.e., 425° C. or below). Thus, thermal treatments of these films to remove Si—H may not be possible. Exposure of the organosilicate film to a UV light source, particularly combined with the application of a heat or other energy source during at least a portion of the exposure step, removes at least a portion of these dangling groups or the Si—H bonds and may "perfect" the film network. The composition of the as-deposited film and the post-UV exposed film is substantially the same. However, the mechanical properties of the UV exposed film, such as the hardness and elastic modulus, is at least 10% greater, preferably 25%, and more preferably 100% greater, than the mechanical properties of the as-deposited film. Further, the dielectric constant of the UV-exposed organosilicate film is substantially the same as, or in the case of porous organosilicate films, at least 5% less than, the dielectric constant of the as-deposited film. It is thus surprising and unexpected to produce low dielectric materials having enhanced mechanical properties at relatively low temperatures.

The organosilicate glass material is preferably a film that is formed onto at least a portion of a substrate. Suitable substrates that may be used include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("SiO2"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, or diffusion barrier layers, e.g., TiN, Ti(C)N, TaN, Ta(C)N, Ta, W, WN, TiSiN, TaSiN, SiCN, TiSiCN, TaSiCN, or W(C)N. The organosilicate glass films of the present invention are preferably capable of adhering to at least one of the foregoing materials sufficiently to pass a conventional pull test, such as an ASTM D3359-95a tape pull test.

The organosilicate film of the present invention may be a dense or a porous film. A dense organosilicate film has a density that may range from about 1.5 g/cm$^3$ to about 2.2 g/cm³. These films are typically deposited from at least one structure-former precursor, preferably an organosilane or organosiloxane precursor.

In other embodiments of the present invention, the organosilicate film is a porous or composite film. These films are typically comprised of at least one structure-former material and at least one pore-former material and are deposited by at least one structure-former precursor and at least one pore-former precursor. The at least one pore-former material may be dispersed within the structure-former material. The term "dispersed" as used herein includes discrete areas of pore-former material, air-gap (i.e., relatively large areas of pore-former material contained within a structure-former shell), or bicontinuous areas of the structure-former and the pore-former materials. While not intending to be bound by theory, it is believed that the porous organosilicate film, when exposed to one or more energy sources, adsorbs a certain amount of energy to enable the removal of at least a portion of the pore-former material from the as-deposited film while leaving the bonds within the structure-former material intact. Depending upon the energy source and the chemistry of the pore-former material, the chemical bonds within the pore-former material may be broken thereby facilitating its removal from the material. In this manner, the pore-former material may be substantially removed from the organosilicate film thereby leaving a porous film that consists essentially of the structure-former material. The resultant porous organosilicate film, after exposure to one or more energy sources, may exhibit a lower density and lower dielectric constant than the as-deposited film.

The organosilicate glass (OSG) film of the present invention comprises a structure-former material that is capable of forming and maintaining an interconnecting network. Examples of the organosilicate glass films and the structure-former material contained therein include, but are not limited to, silicon carbide (SiC), hydrogenated silicon carbide (Si:C:H), silicon oxycarbide (Si:O:C), silicon oxynitride (Si:O:N), silicon nitride (Si:N), silicon carbonitride (Si:C:N), fluorosilicate glass (Si:O:F), organofluorosilicate glass (Si:O:C:H:F), organosilicate glass (Si:O:C:H), diamond-like carbon, borosilicate glass (Si:O:B:H), or phosphorous doped borosilicate glass (Si:O:B:H:P).

In certain preferred embodiment, the structure-former material comprises a silica compound. The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In certain preferred embodiments, the structure-former material may comprise an OSG compound represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic % and z is from 0 to 15 atomic %. Regardless of whether or not the structure-former is unchanged throughout the inventive process, the term "structure-former" as used herein is intended to encompass structure-forming reagents or precursors (or structure-forming substituents) and derivatives thereof, in whatever forms they are found throughout the entire process of the invention.

In embodiments wherein the organosilicate film is porous, the organosilicate film comprises at least one pore-former material in addition to the structure-former material. The pore-former material comprises a compound(s) that is capable of being easily and preferably substantially removed from the organosilicate film upon exposure to one or more energy sources. The pore-former material may also be referred to as a porogen. A "pore-former", as used herein, is a reagent that is used to generate void volume within the resultant film. Regardless of whether or not the pore-former is unchanged throughout the inventive process, the term "pore-former" as used herein is intended to encompass pore-forming reagents or precursors (or pore-forming substituents) and derivatives thereof, in whatever forms they are found throughout the entire process of the invention. Suitable compounds to be used as pore-former precursors include, but are not limited to, hydrocarbon materials, labile organic groups, decomposable polymers, surfactants, dendrimers, hyperbranched polymers, polyoxyalkylene compounds, or combinations thereof.

As mentioned previously, the organosilicate films are deposited onto at least a portion of a substrate from a precursor composition or mixture using a variety of different methods. These methods may be used by themselves or in combination. Some examples of processes that may be used to form the organosilicate film include the following: thermal chemical vapor deposition, plasma enhanced chemical vapor deposition ("PECVD"), high density PECVD, photon assisted CVD, plasma-photon assisted CVD, cryogenic chemical vapor deposition, chemical assisted vapor deposition, hot-filament chemical vapor deposition, photo initiated chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the organosilicate film of the present invention. In certain preferred embodiments, the deposition is conducted at a temperature ranging from 100 to 425° C., preferably from 250 to 425° C. Although the chemical reagents used herein may be sometimes described as "gaseous", it is understood that the chemical reagents may be delivered directly as a gas to the reactor, delivered as a vaporized liquid, a sublimed solid and/or transported by an inert carrier gas into the reactor.

In preferred embodiments of the present invention, the organosilicate film is formed through a plasma-enhanced chemical vapor deposition process. Briefly in a PECVD process, chemical reagents are flowed into a reaction chamber such as a vacuum chamber and plasma energy energizes the chemical reagents thereby forming a film on at least a portion of the substrate. In these embodiments, the organosilicate film can be formed by the co-deposition, or alternatively the sequential deposition, of a gaseous mixture comprising at least one silica containing, preferably organosilicon material, that forms the structure-former material with at least one plasma-polymerizable organic material that forms the pore-former material. In certain embodiments, the plasma energy applied to the reagents may range from 0.02 to 7 watts/cm², more preferably 0.3 to 3 watts/cm². Flow rates for each of the reagents may range from 10 to 5000 standard cubic centimeters per minute (sccm). Pressure values in the vacuum chamber during deposition for a PECVD process of the present invention may range from 0.01 to 600 torr, more preferably 1 to 10 torr. It is understood, however, that process parameters such as plasma energy, flow rate, and pressure may vary depending upon numerous factors such as the surface area of the substrate, the structure-former and pore-former precursors used, the equipment used in the PECVD process, etc.

In a certain preferred embodiment of the present invention wherein the organosilicate glass film consists essentially of Si, C, O, H, and optionally F, the film is formed by providing a substrate within a vacuum chamber; introducing into the vacuum chamber chemical reagents that comprise at least one structure-former precursor selected from the group consisting of an organosilane and an organosiloxane, and optionally a pore-former precursor distinct from the at least one structure-former precursor; and applying energy to the reagents in said chamber to induce reaction of the reagents and to form the film on the substrate. Examples of chemical reagents used as structure-former and pore-former precursors may be found in pending U.S. Pat. Nos. 6,583,048, 6,846,515, and 6,716,770, and U.S. patent application Publication No. 2004/0096593 A1, which are commonly assigned to the assignee of the present invention and incorporated herein by reference in its entirety.

Silica-containing compounds such as organosilanes and organosiloxanes are the preferred precursors to form the structure-former material of the organosilicate glass film. Suitable organosilanes and organosiloxanes include, e.g.: (a) alkylsilanes represented by the formula $R^1{}_n SiR^2{}_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyltriethoxysilane, methyldiethoxysilane, triethoxysilane, trimethylphenoxysilane and phenoxysilane); (b) a linear organosiloxane represented by the formula $R^1(R^2{}_2 SiO)_n SiR^2{}_3$ where n is an integer from 1 to 10, or a cyclic organosiloxane represented by the formula $(R^1 R^2 SiO)_n$ where n is an integer from 2 to 10 and $R^1$ and $R^2$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^2(SiR^1 R^2)_n R^2$ where n is an integer from 2 to 10, or cyclic organosilane represented by the formula $(SiR^1 R^2)_n$, where n is an integer from 3 to 10, and $R^1$ and $R^2$ are as defined above (e.g., 1,2-dimethyldisilane, 1,1,2,2-tetramethyldisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisilane). In certain embodiments, the organosilane/organosiloxane is a cyclic alkylsilane, a cyclic alkylsiloxane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene, octamethyltetracyclosiloxane (OMCTS), or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate, and di-tert-butoxydiacetoxysilane.

In certain embodiments, the at least one structure-former material further comprises fluorine. Preferred fluorine-providing chemical reagents for a PECVD-deposited organosilicate film lack any F—C bonds (i.e., fluorine bonded to carbon), which could end up in the film. Thus, preferred fluorine-providing reagents include, e.g., $SiF_4$, $NF_3$, $F_2$, HF, $SF_6$, $ClF_3$, $BF_3$, $BrF_3$, $SF_4$, $NF_2Cl$, $FSiH_3$, $F_2SiH_2$, $F_3SiH$, organofluorosilanes and mixtures thereof, provided that the organofluorosilanes do not include any F—C bonds. Additional preferred fluorine-providing reagents include the above mentioned alkylsilanes, alkoxysilanes, linear and cyclic organosiloxanes, linear and cyclic organosilane oligomers, cyclic or bridged organosilanes, and organosilanes with reactive side groups, provided a fluorine atom is substituted for at least one of the silicon substituents, such that there is at least one Si—F bond. More specifically, suitable fluorine-providing reagents include, e.g., fluorotrimethylsilane, difluorodimethylsilane methyltrifluorosilane, fluorotriethoxysilane, 1,2-difluoro-1,1,2,2,-tetramethyldisilane, or difluorodimethoxysilane.

In certain preferred embodiments, the mixture used to form the organosilicate film preferably comprises a silica source that may form the structure-former material. A "silica source", as used herein, is a compound having silicon (Si) and oxygen (O), and possibly additional substituents such as, but not limited to, other elements such as H, B, C, P, or halide atoms; alkyl groups; or aryl groups. The term "alkyl" as used herein includes straight chain, branched, or cyclic alkyl groups, preferably containing from 1 to 24 carbon atoms, or more preferably from 1 to 13 carbon atoms. This term applies also to alkyl moieties contained in other groups such as haloalkyl, alkaryl, or aralkyl. The term "alkyl" further applies to alkyl moieties that are substituted. The term "aryl" as used herein includes six to twelve member carbon rings having aromatic character. The term "aryl" also applies to aryl moieties that are substituted. The silica source may include materials that have a high number of Si—O bonds, but can further include Si—O—Si bridges, Si—R—Si bridges, Si—C bonds, Si—F bonds, Si—H bonds or a portion of the material can also have C—H bonds. Other examples of a silica source may include a fluorinated silane or fluorinated siloxane such as those provided in U.S. Pat. No. 6,258,407. Another example of a silica source may include compounds that produce a Si—H bond upon removal of the pore-former material.

Still other examples of silica sources include silsesquioxanes such as hydrogen silsesquioxanes (HSQ, $HSiO_{1.5}$) and methyl silsesquioxanes (MSQ, $RSiO_{1.5}$ where R is a methyl group).

Further examples of the suitable silica sources include those described in U.S. Pat. No. 6,271,273 and EP Nos. 1,088,868; 1,123,753, and 1,127,929. In preferred embodiments, the silica source may be a compound represented by the following: $R_a Si(OR^1)_{4-a}$, wherein R represents a hydrogen atom, a fluorine atom, or a monovalent organic group; $R^1$ represents a monovalent organic group; and a is an integer of 1 or 2; $Si(OR^2)_4$, where $R^2$ represents a monovalent organic group; or $R^3{}_b(R^4 O)_{3-b}Si—(R^7)_d—Si(OR^5)_{3-c}R^6{}_c$, wherein $R^3$ to $R^6$ may be the same or different and each represents a monovalent organic group; b and c may be the same or different and each is a number of 0 to 2; $R^7$ represents an oxygen atom, a phenylene group, or a group represented by $—(CH_2)_n$, wherein n is an integer of 1 to 6; d is 0 or 1; or combinations thereof. The term "monovalent organic group" as used herein relates to an organic group bonded to an element of interest, such as Si or O, through a single C bond, i.e., Si—C or O—C.

In embodiments wherein a porous OSG film is formed, at least one of the gaseous reagents is a pore-former precursor. The pore-former precursor is preferably deposited in the same manner as the structure-former precursor. The pore-former precursor can be deposited, for example, in a mixture with the structure-former precursor, co-deposited with the structure-former precursor, or deposited in an alternating fashion with the structure-former precursor. In subsequent process steps, the pore-former precursor is used to generate void volume within the resultant porous film upon its removal. The pore-former in the porous OSG film may or may not be in the same form as the pore-former within the mixture and/or introduced to the reaction chamber. As well, the pore-former removal process may liberate the pore-former or fragments thereof from the film. In essence, the pore-former reagent (or pore-former substituent attached to the precursor), the pore-former in the organosilicate film, and the pore-former being removed may or may not be the same species, although it is preferable that they all originate from the pore-former reagent (or pore-former substituent).

In certain embodiments of the present invention, the pore-former may be a hydrocarbon compound, preferably having from 1 to 13 carbon atoms. Examples of these compounds include, but are not limited to, alpha-terpinene, limonene, cyclohexane, gamma-terpinene, camphene, dimethylhexadiene, ethylbenzene, norbornadiene, cyclopentene oxide, 1,2,4-trimethylcyclohexane, 1,5-dimethyl-1,5-cyclooctadiene, camphene, adamantane, 1,3-butadiene, substituted dienes, alpha-pinene, beta-pinene, and decahydronaphthelene.

In certain embodiments of the present invention, the pore-former may include labile organic groups. When some labile organic groups are present in the reaction mixture, the labile organic groups may contain sufficient oxygen to convert to gaseous products during the cure step. In yet other embodiments of the present invention, a film is deposited via CVD from a mixture comprising the labile organic groups with a peroxide compound followed by thermal annealing. Some examples of compounds containing labile organic groups include the compounds disclosed in U.S. Pat. No. 6,171,945, which is incorporated herein by reference in its entirety.

The pore-former could also be a decomposable polymer. The decomposable polymer may be radiation decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The pore-former may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", 2nd Supplement, Aggarwal, pp. 71-132 (1996) which is incorporated herein by reference in its entirety.

In certain embodiments of the present invention, a single compound may function as both the structure-former and pore-former within the porous OSG film. That is, the structure-former precursor and the pore-former precursor are not necessarily different compounds, and in certain embodiments, the pore-former is a part of (e.g., covalently bound to) the structure-former precursor. Examples of these materials may be found, for example, in pending U.S. Pat. Nos. 6,716, 770 and 6,846,515, that are commonly assigned to the assignee of the present invention and incorporated herein by reference in their entirety. For example, it is possible to use 1-neohexyl-1,3,5,7-tetramethyl-cyclotetrasiloxane ("neohexyl TMCTS") as a single species, whereby the TMCTS portion of the molecule forms the base OSG structure and the bulky alkyl substituent neohexyl is the pore-former species which is removed, for example, during the anneal process. Having the pore-former attached to a Si species that will network into the OSG structure may be advantageous in achieving a higher efficiency of incorporation of pore-former into the film during the deposition process. Furthermore, it may also be advantageous to have two pore-formers attached to one Si in the precursor, such as in di-neohexyl-diethoxysilane, or two Si's attached to one pore-former, such as in 1,4-bis(diethoxysilyl)cyclohexane. While not intending to be bound by theory, the reaction of one Si-pore-former bond in the plasma may enable the incorporation of the second pore-former group into the deposited film.

In certain embodiments of the materials in which a single or multiple pore-former is attached to silicon, it may be advantageous to design the pore-former in such a way that when the film is cured to form the pores, a part of the pore-former remains attached to the silicon to impart hydrophobicity to the film. Under proper conditions this it is believed that this would leave a terminal —$CH_3$ group bonded to the Si to provide hydrophobicity and a relatively lower dielectric constant to the film. Examples of precursors are neopentyl triethoxysilane, neopentyl diethoxy silane, and neopentyl diethoxymethylsilane.

In certain embodiments of the present invention, an additional reagent such as a reducing agent may be added to the environment during the pore-former removal process. The additional reagent may be added to enhance the removal of the one or more pore-former materials from the organosilicate film.

Figure 1B:
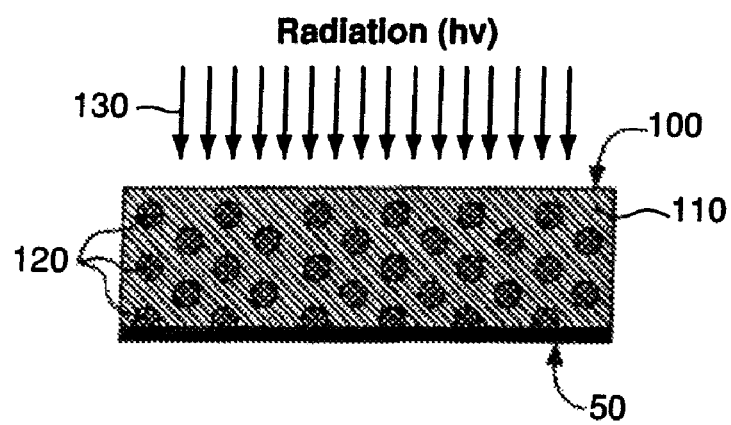
Figure 1C:
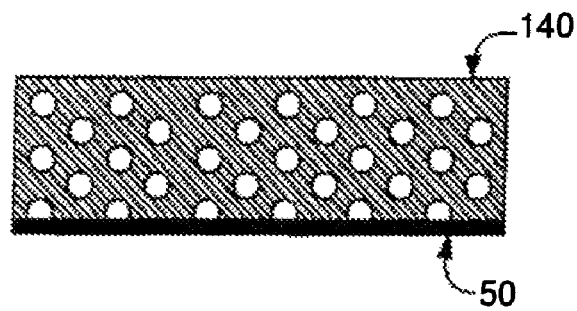

FIGS. 1a through 1c provide an illustration of one embodiment of the method of the present invention for forming a porous OSG film. Referring to FIG. 1a, a film 100 is formed upon at least a portion of a substrate 50. Film 100 comprises at least two materials: at least one structure-former material 110 and at least one pore-former material 120 dispersed within the structure-former material 110. In certain preferred embodiments, the structure-former material 110 is a compound containing primarily Si:O:C:H and the at least one pore-former material 120 is an organic compound containing primarily C:H. In FIG. 1b, film 100 is exposed to one or more energy sources such as ultraviolet light 130. The exposure step depicted in FIG. 1b may be conducted at one or more temperatures below 425° C. and for a short time interval thereby consuming as little of the overall thermal budget of substrate 50 as possible. Referring now to FIG. 1c, the pore-former material 120 is substantially removed from film 100 leaving a porous OSG film 140. The resultant porous film 140 will have a lower dielectric constant, at least 5% or less than, and a higher material hardness and modulus, at least 10%, preferably at least 25% or greater than the dielectric constant, material hardness and modulus of the as-deposited film 100 prior to exposure.

As mentioned previously, the dense or porous OSG film is exposed to one or more ultraviolet light sources ranging from 200 to 400 nm to enhance the mechanical properties of the film. This exposure step can be in lieu of, or in addition to, an annealing step. The temperature that the substrate is subjected to during exposure to an ultraviolet light source typically ranges from between 25 to 425° C. The dielectric constant of the structure-former material(s) remains essentially the same by the exposure to the ultraviolet light source.

The organosilicate film may be exposed to one or more wavelengths within the ultraviolet spectrum or one or more wavelengths within the ultraviolet spectrum such as deep ultraviolet light (i.e., wavelengths of 280 nm or below) or vacuum ultraviolet light (i.e., wavelengths of 200 nm or below). The ultraviolet light may be dispersive, focused, continuous wave, pulsed, or shuttered. Sources for the ultraviolet light include, but are not limited to, an excimer laser, a barrier discharge lamp, a mercury lamp, a microwave-generated UV lamp, a laser such as a frequency doubled or frequency tripled laser in the IR or visible region, or a two-photon absorption from a laser in the visible region. The ultraviolet light source may be placed at a distance that ranges from 50 milli-inches to 1,000 feet from the organosilicate film.

In certain preferred embodiments, the exposure step is conducted in a non-oxidizing atmosphere such as an inert atmosphere (e.g., nitrogen, helium, argon, xenon, krypton, radon, etc.), a reducing atmosphere (e.g., $H_2$, CO), or vacuum. It is believed that the presence of oxygen during the exposure step may substantially modify the structure forming material(s) of the film and/or increase the dielectric constant of the film. Further, it is believed that the presence of oxygen may interfere with the removal of the pore-former precursor in embodiments where a porous OSG film is formed.

The organosilicate film may be exposed to one or more specific wavelength within the UV light source or a broad spectrum of wavelengths. For example, the composite film may be exposed to one or more particular wavelengths of light such as through a laser and/or optically focused light source. In the latter embodiments, the radiation source may be passed through optics such as lenses (e.g., convex, concave, cylindrical, elliptical, square or parabolic lenses), filters (e.g., RF filter), windows (e.g., glass, plastic, fused silica, synthetic silica, silicate, calcium fluoride, lithium fluoride, or magnesium fluoride windows) or mirrors to provide specific and focused wavelengths of light. In these embodiments, a non-reactive gas may be flowed over the optics during at least a portion of the exposing step to prevent the formation of build-up on the surface of the optics formed by off-gassing during the pore-formation step. Alternatively, the radiation source does not pass through any optics.

Figure 4:
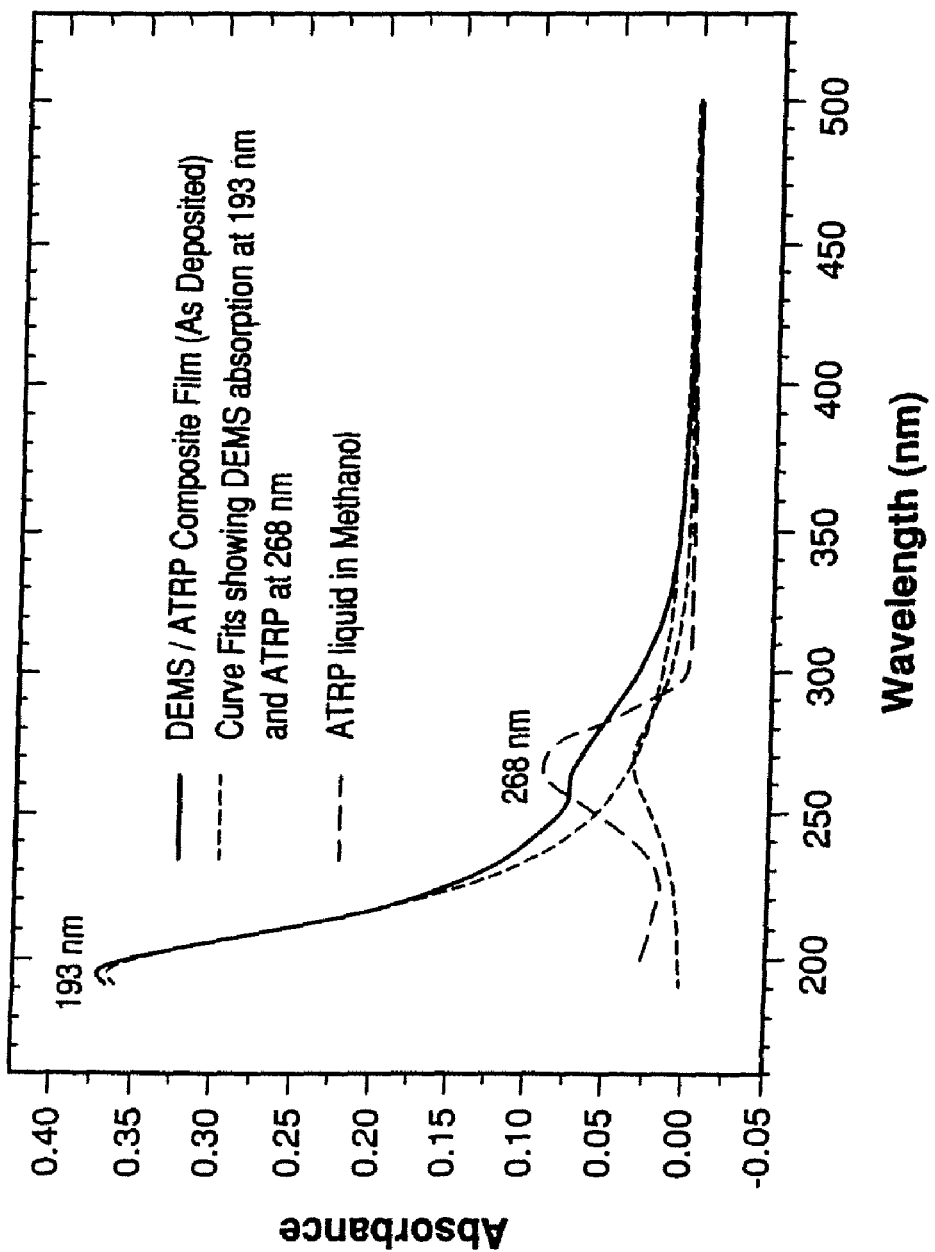
FIG. 4 provides the UV/V absorption spectrum of the as-deposited porous OSG glass film deposited using a DEMS structure-former precursor and an ATRP pore-former precursor and the UV/V absorption spectrum of an ATRP liquid.

In certain embodiments, the ultraviolet light source is passed through optics to keep the temperature of the substrate relatively low during the exposing step by adjusting the ultraviolet light to a particular wavelength. For example, FIG. 4 provides the UV/visible light absorption spectrum of an as-deposited film deposited from a DEMS structure-former precursor and an ATRP pore-former precursor and the UV/visible light absorption spectrum of an ATRP liquid. The spectrum shows a peak at a wavelength of 265 nm, which relates to the presence of C—C bonds within the film. Providing a focused UV light source in the 265 nm wavelength range may remove the ATRP pore-former in less time and at a lower substrate temperature. Specific temperature and time durations for the exposure step may vary depending upon the chemical species used to form the organosilicate film. In certain preferred embodiments, the exposure step is conducted at a temperature below about 425° C., preferably below about 300° C., and more preferably below about 250° C. The exposure step is conducted for a time of about 60 minutes or less, preferably about 10 minutes or less, and more preferably about 10 seconds or less. In certain embodiments of the present invention, the temperature of the substrate having the OSG film deposited thereupon ranges from 25 to 425° C., preferably 250 to 425° C. In these embodiments, the substrate may be placed on a heated platform, platen, or the like.

The exposure step may be conducted in a variety of settings depending upon the process used to form the organosilicate film. It may be advantageous for the exposure step to be conducted after or even during at least a portion of the organosilicate film formation step. The exposure step can be performed in various settings such as, but not limited to, quartz vessel, a modified deposition chamber, a conveyor belt process system, a hot plate, a vacuum chamber, a cluster tool, a single wafer instrument, a batch processing instrument, or a rotating turnstile.

The organosilicate film of the present invention may be further subjected to other post deposition steps such as treating the porous film with one or more energy sources. The energy source for the treating step may include, but not be limited to, α-particles, β-particles, γ-rays, x-rays, high energy electron, electron beam sources of energy, ultraviolet (wavelengths ranging from 10 to 400 nm), visible (wavelengths ranging from 400 to 750 nm), infrared (wavelengths ranging from 750 to $10^5$ nm), microwave frequency (>$10^9$ Hz), radio-frequency (>$10^6$ Hz), thermal sources; plasma; or mixtures thereof. This treatment step may be performed before, during, or after the exposing step. Preferably, the treatment step may be performed prior to, or during, at least a portion of the exposing step. The treatment step may further increase the mechanical integrity of the material by, for example, promoting cross-linking within the porous film, stabilize the porous film, and/or remove additional chemical species from the network during at least a portion of the removal of the pore-former precursor.

The one or more energy sources can include any of the energy sources disclosed herein as well as thermal sources such as a hot plate, oven, furnace, RTA (rapid thermal annealing), infrared radiation sources, and the like. In certain preferred embodiments, the treatment step is conducted using thermal energy prior to and/or during at least a portion of the UV exposure step. In these embodiments, the mechanical properties of the film may be substantially increased in comparison to thermal annealing and/or UV exposure alone.

In another embodiment of the present invention, the treatment step may be conducted using UV light. This treatment step differs from the UV exposure step in that the exposure step substantially removes the pore-former material from the organosilicate film to provide a porous film and the treatment step may, for example, improve the mechanical properties of the film such as hardness and modulus. For example, the UV exposure step may occur for a duration ranging from about 0.1 to about 5 minutes, preferably about 0.1 to about 1 minute, to substantially remove the pore-former material contained therein and provide the porous OSG film; the UV treatment step may occur thereafter for a duration ranging from about 1 to about 20 minutes, preferably about 5 to about 20 minutes. Both UV exposure and UV treatment steps may be conducted using the same lamp, purge gas chemistry, and/or chamber to improve process throughput. In these embodiments, further post-treatment steps, such as treatment with other energy sources and/or chemical treatments, may also be conducted.

The conditions under which the treatment step is conducted can vary greatly. For example, the treatment step can be conducted under high pressure or under a vacuum ambient. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal energy sources as well as any other post-treating means. The temperature may range from 25 to 450° C., preferably from 200 to 450° C. The temperature ramp rate may range from 0.1 to 100 deg° C./min. The total treatment time may range from 0.01 min to 12 hours, preferably from 1 to 240 min.

In certain embodiments of the present invention, the OSG film may be subjected to a chemical treatment that may include, for example, the use of fluorinating (HF, $SiF_4$, $NF_3$, $F_2$, $COF_2$, $CO_2F_2$, etc.), oxidizing ($H_2O_2$, $O_3$, etc.), chemical drying, methylating, or other chemical treatments. Chemicals used in such treatments can be in solid, liquid, gaseous and/or supercritical fluid states. In certain embodiments, supercritical fluid treatment may be used to treat the film. The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

In embodiments wherein the OSG film is treated with a plasma, the plasma is conducted under the following conditions: the environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-10 W/$cm^3$. The temperature preferably ranges from ambient to 425° C. The pressure preferably ranges from 10 mtorr to atmospheric pressure. The total treatment time is preferably 0.01 min to 12 hours.

Photocuring post-treatment may be conducted under the following conditions: the environment can be inert (e.g., nitrogen, $CO_2$, noble gases (He, Ar, Ne, Kr, Xe), etc.), or reducing (e.g., dilute or concentrated hydrocarbons, hydrogen, etc.). The temperature is preferably ambient to 425° C. The power is preferably 0-10 W/$cm^3$. The wavelength is preferably IR, visible, UV or deep UV (wavelengths <200 nm). The total curing time is preferably 0.01 min to 12 hours.

Microwave post-treatment may be conducted under the following conditions: the environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post-treatment may be conducted under the following conditions: the environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1.

In certain embodiments of the present invention, the organosilicate films are porous. The average pore sizes within the porous film ranges from about 1 Å to about 500 Å, preferably from about 1 Å to about 100 Å, and most preferably from about 1 Å to about 50 Å. It is preferred that the film have pores of a narrow size range and that the pores are homogeneously distributed throughout the film. However, the porosity of the film need not be homogeneous throughout the film. In certain embodiments, there is a porosity gradient and/or layers of varying porosities. Such films can be provided by, e.g., adjusting the ratio of pore-former material to structure-former material during formation of the porous organosilicate film. The porosity of the films may have continuous or discontinuous pores. The porous films of the invention preferably have a density of 2.0 g/$cm^3$ or less, or alternatively, 1.5 g/$cm^3$ or less, or 1.25 g/$cm^3$ or less. Preferably, the porous films of the invention have a density at least 10% less, preferably at least 25% less, and more preferably at least 50% less than the density of the unexposed film.

The porous films of the invention have a lower dielectric constant relative to the dense OSG materials. Dense OSG films has a dielectric constant ranging from 2.7 to 3.5 whereas porous OSG films of the invention have a dielectric constant of about 2.7 or below, preferably about 2.4 or below, and more preferably about 2.2 or below.

In certain embodiments, the dense or porous OSG films of the invention are thermally stable, with good chemical resistance. In particular, the films after the UV exposure step have an average weight loss of less than 1.0 wt %/hr isothermal at 425° C. under $N_2$.

The films are suitable for a variety of uses. The films are particularly suitable for deposition on a semiconductor substrate, and are particularly suitable for use as, e.g., an insulation layer, an interlayer dielectric layer and/or an intermetal dielectric layer. The films can form a conformal coating. The properties exhibited by these films make them particularly suitable for use in Al subtractive technology and Cu damascene or dual damascene technology.

Because of their enhanced mechanical properties, the films are compatible with chemical mechanical planarization (CMP) and anisotropic etching, and are capable of adhering to a variety of substrate materials, such as silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, organic polymers, porous organic and inorganic materials, metals such as copper and aluminum, and diffusion barrier layers such as but not limited to TiN, Ti(C)N, TaN, Ta(C)N, Ta, W, or WN.

The present invention also discloses a mixture for forming a dense or a porous OSG film having a dielectric constant of 3.5 or below suitable for exposure to UV light. The OSG film may be formed by a variety of deposition processes including CVD-related and spin-on-glass processes. For dense OSG films, the mixture comprises at least one structure-former precursor and/or resultant OSG film that exhibits an absorbance in the 200 to 400 nm wavelength range. For porous OSG films, the mixture may comprise from 5% to 95% by weight of a structure-former precursor and from 5% to 95% by weight of a pore-former precursor wherein the at least one of the precursors and/or the organosilicate film exhibits an absorbance in the 200 to 400 nm wavelength range. Depending upon the deposition process, such as for spin-on-glass deposition, the mixture may comprise additional additives, for example, a solvent, a catalyst, a surfactant, water, and the like. Additional additives to the mixture used for spin-on-glass deposition may be found, for example, in pending U.S. patent application Publication No. 2004/0096593 A1, which is commonly assigned to the assignee of the present invention and incorporated herein by reference in its entirety.

The dielectric material and film of the present invention exhibit a substantial uniformity in composition. Compositional uniformity describes a film property wherein the composition is relatively uniform with relatively little deviation in composition from the surface to the base of the film. A film that exhibits substantial uniformity in composition may avoid problems associated with the formation of a "skin layer". For example, the use of UV light or electron beams during the exposing and/or treating steps may form a "skin layer" that is compositionally different than the underlying bulk film because the radiation sufficient to remove the pore-former material within the composite film may also modify the structure-former material at the surface where the radiation flux is maximum.

To enable comparisons, the result can be expressed as percent non-uniformity. Preferably, the percent non-uniformity is about 10% or less, more preferably about 5% or less, most preferably about 2% or less. Compositional uniformity can be determined, for example, by using electrical measurements (e.g., 4-point probe), SIMS (Secondary Ion Mass Spectrometry), RBS (Rutherford Backscattering Spectroscopy), Spectroscopic Ellipsometry and/or high resolution X-ray diffractometry (HR-XRD).

Compositional uniformity is preferably measured using SIMS across a wafer substrate onto which the OSG film has been deposited. In one preferred method, SIMS measurements are made through the depth of the film. For each element in question, the distribution of that element through the film is then determined from the SIMS data, and the resulting value expressed in intensity measured at a detector, which is related to its concentration in the film at any given depth. The values are then averaged, and the standard deviation determined.

For a given OSG film, compositional non-uniformity may be compared using the standard deviation divided by the sum of the maximum and minimum measured values, and the result expressed as a percentage. For example, if a dynamic SIMS depth of profile is performed at a single point for a given OSG film and the average intensity of the carbon signal is $1.255 \times 10^6$ counts with a standard deviation of $1.987 \times 10^4$ counts, and the minimum intensity throughout the film is $1.21 \times 10^6$ counts and the maximum intensity is $1.3 \times 10^6$ counts, then the compositional non-uniformity is 0.8% because the sum of the minimum and maximum values is $1.51 \times 10^6$, the standard deviation is $1.987 \times 10^4$, and $1.987 \times 10^4$ divided by $1.51 \times 10^6$ equals 0.8%.

Preferred values of compositional non-uniformity may vary depending on the amount of the element in the OSG film. If the amount of element is 1 atomic % or greater, the compositional non-uniformity for the Si-containing film is about 15% or less, more preferably about 10% or less, even more preferably about 5% or less, most preferably about 1% or less. Therefore, the compositional non-uniformity of the major elements within the OSG film, i.e., silicon, oxygen, hydrogen, and carbon, is 15% or less, more preferably 10% or less, and most preferably 5% or less.

Although the invention is particularly suitable for providing films and products of the invention are largely described herein as films, the invention is not limited thereto. Products of the invention can be provided in any form such as coatings, multilaminar assemblies, and other types of objects that are not necessarily planar or thin, and a multitude of objects not necessarily used in integrated circuits. Preferably, the substrate is a semiconductor.

The invention will be illustrated in more detail with reference to the following examples, but it should be understood that the present invention is not deemed to be limited thereto.

EXAMPLES

Exemplary dense and porous OSG glass films were formed via a plasma enhanced CVD process using an Applied Materials Precision-5000 system in a 200 mm D×Z vacuum chamber that was fitted with an Advanced Energy 200 rf generator from a variety of different chemical precursors and process conditions. Unless otherwise stated, the glass films were deposited onto low resistivity (R<0.02 Ω·cm) silicon wafers. The CVD process generally involved the following basic steps: initial set-up and stabilization of gas flows, deposition, and purge/evacuation of chamber prior to wafer removal. The thickness and refractive index of each film were measured by reflectometry using standard methods. The dielectric constant of each film was determined using the mercury probe capacitance technique on low resistivity p-type wafers (R<0.02 ohm-cm). Mechanical properties were determined using a MTS Nano Indenter. Transmission FTIR spectra were determined using a Thermo-Nicolet 750 Spectrophotometer at 4 cm$^{-1}$ resolution on high resistivity wafers (R>5 ohm-cm).

Thermal post-treatment or annealing was performed in an Applied Test Systems, Inc. series 3210 tube furnace fitted with 4" diameter purged quartz tube with a nitrogen purge ranging from 2 to 4 slpm. The ramp rate was 13° C. per minute from 25 to 425° C. At 425° C., the films were soaked for 240 minutes. The films were allowed to cool to below 100° C. before removal from the furnace.

Unless otherwise stated, UV exposure was performed using a Fusion UV model F305 ultraviolet lamp with an I300 MB irradiator unit, P300 power supply, and a "D" bulb, which provides radiation ranging from 200 to 450 nm. The distance between the face of the irradiator unit and the sample is approximately 3 inches. The samples were contained within a 2" diameter quartz process tube equipped with either the vacuum or the nitrogen purge. The films subjected to UV exposure were placed in a 2" diameter quartz glass tube with end caps capable of sealing to nitrogen purge or vacuum. In examples involving a vacuum or inert atmospheres, three pump and purge cycles were performed prior to UV exposure to ensure that any oxygen concentrations within the sample tube were below 50 ppm. Films were exposed to UV radiation for between 0 and 30 minutes.

Example 1

Formation of a Dense OSG Film Using Diethoxymethylsilane (DEMS) and Triethoxysilane (TES)

An organosilicate glass film was formed onto a silicon wafer via plasma enhanced chemical vapor deposition (PECVD) of the structure-former precursors DEMS (773 mg/min) and TES (773 mg/min) using $CO_2$ as the carrier gas at a flow rate of 500 sccm. The deposition was performed at 6 torr, 600 W plasma power, and 400 milli-inch (mils) spacing between the top electrode and silicon wafer substrate. The wafer temperature during deposition was maintained at 300° C. The deposition rate of the film was 540 nm/min.

The properties of the OSG film after deposition (example 1a), after thermal anneal (example 1b), and after exposure to a UV light source (example 1c) are provided in Table I. As Table I illustrates, films 1b and 1c, which were thermally annealed and exposed to UV light respectively, exhibited a slight decrease in dielectric constant relative to example 1a or the as-deposited film. However, film 1c also exhibited a significant increase in hardness, or an approximately 23% increase in hardness, from example 1a. Example 1b, by contrast, exhibited an approximately 3% increase in hardness from example 1a. Thus, the UV exposure step provides a significant improvement in the mechanical properties of the OSG glass film relative to thermal post-treatment while using milder processing conditions.

Example 2

Formation of a Dense OSG Films Using 1,3-dimethyl-1,3-diethoxy-disiloxane (MEDS)

An organosilicate glass film was formed onto silicon wafer via PECVD of 700 mg/min of the structure-former precursor MEDS and $CO_2$ as the carrier gas at a flow rate of 250 sccm. The deposition was performed at 6 torr, 600 W plasma power, and 350 mils spacing. The wafer temperature during deposition was maintained at 250° C. The deposition rate of the film was 1330 nm/minute.

The properties (i.e., thickness, refractive index, dielectric constant, and hardness) of the OSG film after deposition (example 2a), after thermal anneal (example 2b), and after exposure to a UV light source (example 2c) are provided in Table I. As Table I illustrates, both films 2b and 2c, which were thermally annealed and exposed to UV light respectively, exhibited a slight increase in dielectric constant relative to film 2a or the as-deposited film. However, example film 2c exhibited a significant increase, or approximately 96% increase, in hardness from example 2a. Example 2b, by contrast, exhibited an approximately 14% increase in hardness from example 2a. Thus, UV exposure provides a significant improvement in the mechanical properties of the OSG glass film relative to thermal post-treatment using milder processing conditions.

Example 3

Formation of a Dense OSG Films Using Trimethylsilane (3MS)

An organosilicate glass film was formed onto silicon wafer via PECVD of 540 sccm of the structure-former precursor 3MS and a flow rate of oxygen of 90 sccm. The deposition was performed at 4 torr, 600 W plasma power, and 260 mils spacing. The wafer temperature during deposition was maintained at 350° C. The deposition rate of the film was 815 nm/minute.

The properties (i.e., thickness, refractive index, dielectric constant, and hardness) of the OSG film after deposition (example 3a) and after exposure to a UV light source (example 3b) are provided in Table I. As Table I illustrates, the exposure of film 3b to UV light lowered its dielectric constant by 0.09 or 4% and increased its hardness by 0.59 GPa or 47% relative to example 3a or the as-deposited film. Thus, UV exposure provides a significant improvement in the mechanical properties and of the OSG glass film relative to thermal post-treatment using milder processing conditions and with no negative effect on its dielectric constant.

TABLE I

Film Properties for Various Dense OSG materials

| Example | Precursor | | Thickness Loss (5%) | Refractive Index | Dielectric Constant | Hardness (GPa) |
| --- | --- | --- | --- | --- | --- | --- |
| 1a | DEMS/TES | As Deposited | N/A | 1.425 | 3.06 | 1.85 |
| 1b | DEMS/TES | Thermal | 0 | 1.415 | 3.03 | 1.91 |
| 1c | DEMS/TES | UV | −3 | 1.420 | 2.97 | 2.27 |
| 2a | MEDS | As Deposited | N/A | 1.415 | 2.79 | 0.70 |
| 2b | MEDS | Thermal | 0 | 1.371 | 2.84 | 0.80 |
| 2c | MEDS | UV | −10 | 1.396 | 2.85 | 1.37 |
| 3a | 3MS | As Deposited | N/A | 1.445 | 3.07 | 1.25 |
| 3b | 3MS | UV | 0 | 1.439 | 2.98 | 1.84 |

Example 4

Formation of a Dense OSG Film Using Dimethyldimethoxysilane (DMDMOS)

An organosilicate glass film was formed onto a silicon wafer via PECVD of 1250 mg/min of the structure-former precursor DMDMOS with 200 sccm of a helium carrier gas and 15 sccm of O2 as an additive. The deposition was performed at 12 torr, 300 W plasma power, and 300 mils spacing. The wafer temperature during deposition was maintained at 350° C. The deposition rate of the film was 110 nm/minute.

The properties of the OSG film after deposition (example 4a) and after exposure to a UV light source (example 4b) are provided in Table II. As Table II illustrates, the UV post-treatment lowered the dielectric constant of the film by 0.1 or 6%. Further, the UV post-treatment improved the modulus and hardness of the film by 5.7 GPA and 0.94 GPa, respectively, or approximately 270% and 274%, respectively.

Example 5

Formation of a Dense OSG Film Using Dimethyldimethoxysilane (DMDMOS)

An organosilicate glass film was formed onto a silicon wafer via PECVD of 750 mg/min of the structure-former precursor DMDMOS with 200 sccm of a helium carrier gas. The deposition was performed at 12 torr, 500 W plasma power, and 300 mils spacing. The wafer temperature during deposition was maintained at 350° C. The deposition rate of the film was 135 nm/minute The properties of the OSG film after deposition (example 5a) and after exposure to a UV light source (example 5b) are provided in Table II. As Table II illustrates, both the dielectric constant and hardness of the film increased upon exposure to UV light. The UV post-treatment increased the dielectric constant by 0.32 or 15% and improved the modulus and hardness of the film by approximately 207% and 170%, respectively. It is not unexpected that such dramatic improvements in the film hardness are accompanied by increases in the dielectric constant of the film. While the lack of change in the refractive index of the film suggests that the material density is not changed appreciably by UV exposure, it is believed that additional bonds such as Si—C—Si bonds that contribute positively to the film hardness may also have a negative impact on the dielectric constant.

film. There is a direct relationship between the substrate temperature at which film deposition occurs and the dielectric constant and hardness of the film. The deposition temperature also influences the magnitude of the changes in film properties that can be affected by post treatment steps such as thermal annealing and UV exposure. For example, DEMS OSG films deposited at temperatures <300° C. can exhibit substantial changes in dielectric constant, refractive index, and hardness upon thermal annealing. This may be due to residual alkoxy groups within the as-deposited films that are not removed during the deposition process. Both thermal anneal and UV exposure post-treatments lower the dielectric constant for DEMS OSG films deposited <300° C. The dielectric constants of the films deposited at temperatures <300° C. are generally decreased to a greater extent by UV exposure versus thermal annealing. However, the thermal anneal post-treatment is slightly more effective than UV treatment for improving the modulus and hardness for films deposited <300° C.

Films deposited at temperatures >300° C. exhibit only small changes in either their dielectric constant or hardness after thermal annealing. This may be because thermally labile species such as alkoxy groups within the DEMS precursor chemical are removed during the deposition process when the substrate temperature is >300° C. Consequently, there is little

TABLE II

Comparison of Properties of Dense DMDMOS OSG Films Before and After UV Exposure

| Example | Precursor | | Thickness Loss | Refractive Index | Dielectric Constant | Modulus (GPa) | Hardness (GPa) |
|---|---|---|---|---|---|---|---|
| 4a | DMDMOS | As Deposited | N/A | 1.387 | 2.75 | 3.36 | 0.54 |
| 4b | DMDMOS | UV | −11% | 1.351 | 2.65 | 9.06 | 1.48 |
| 5a | DMDMOS | As Deposited | N/A | 1.452 | 3.07 | 14.77 | 2.50 |
| 5b | DMDMOS | UV | −8% | 1.451 | 3.39 | 30.62 | 4.25 |

Example 6

Effect of Deposition Temperature on Dense DEMS OSG Films

Exemplary OSG films were formed onto silicon wafers via PECVD using 1,500 mg/min of the structure-former DEMS, 150 sccm of helium as the carrier gas, and 250 sccm $CO_2$ as an additive. The deposition was performed at 6 torr, 500 W plasma power, and 300 mils spacing. The wafer temperature during deposition was varied from 150 to 425° C. A portion of the as-deposited films was thermally annealed at 375° C., 400° C., and 425° C. for 4 hours under a nitrogen atmosphere. Other as-deposited films were exposed to UV light for 15 minutes in a vacuum atmosphere. Still other as-deposited films were thermally annealed at either 375° C. or 400° C. for 4 hours each under a nitrogen atmosphere and then exposed to UV light for 15 minutes in a vacuum atmosphere.

The properties of the resultant films are provided in Table III. The relationship between hardness and dielectric constant for the as-deposited, thermal treated, and UV exposed DEMS OSG films at each deposition temperature is provided in FIG. 2.

Figure 2:
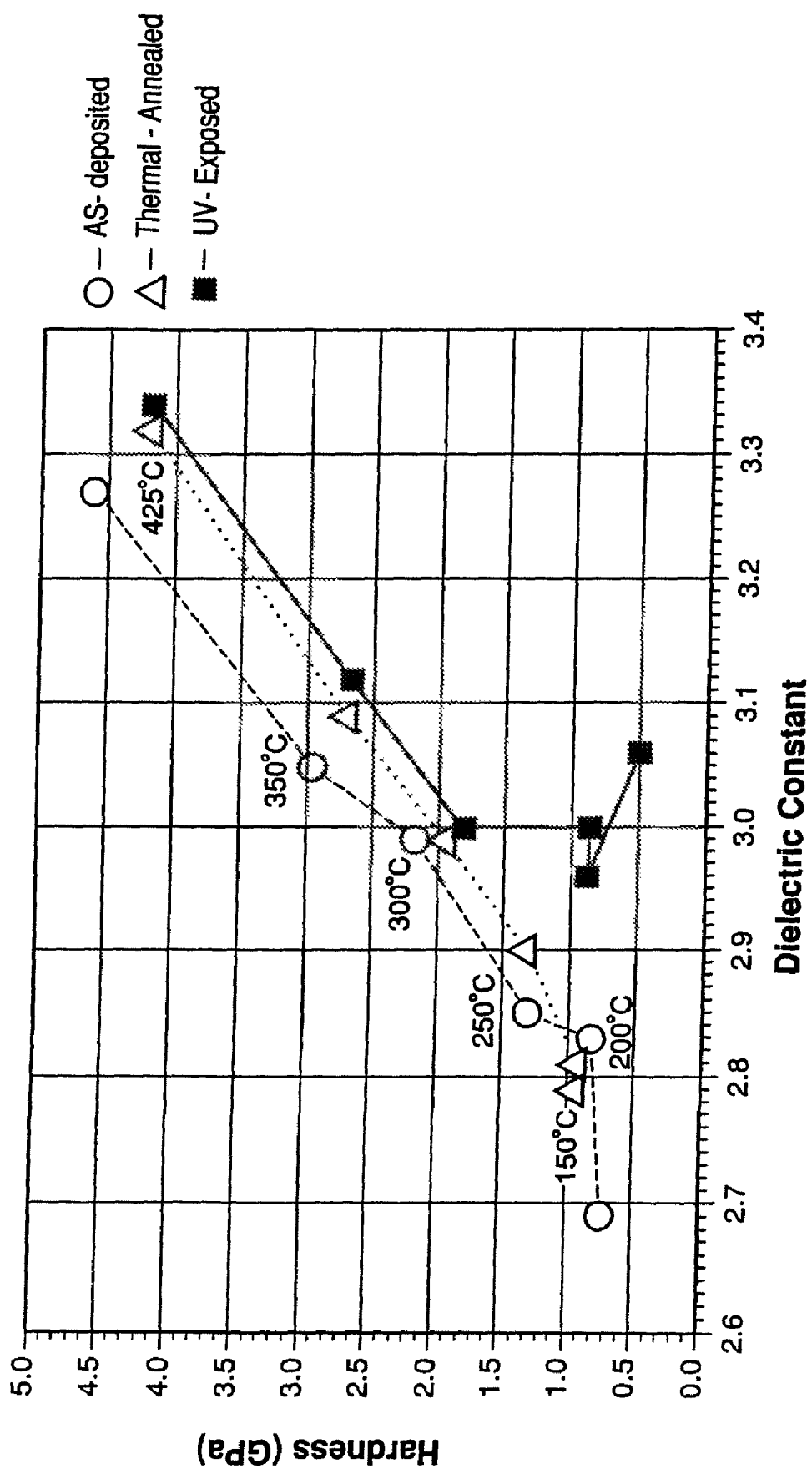
FIG. 2 compares the relationship between hardness and dielectric constant for as-deposited, thermally annealed, and UV exposed dense OSG glass films, deposited using a DEMS structure-former precursor at various processing temperatures.

Referring to Table III and FIG. 2, the deposition temperature has a significant effect on the resultant properties of the change in either the refractive index, dielectric constant, or hardness for these films upon thermal post-treatment. However, UV exposure is still effective at increasing the mechanical strength of these films while maintaining or decreasing the dielectric constant. FIG. 2 illustrates that there is a substantial improvement in modulus and hardness upon UV exposure for films deposited above 300° C. In this regard, films deposited at temperatures below 300° C. did not show a regular relationship between dielectric constant and hardness whereas films deposited above 300° C. displayed a linear relationship between dielectric constant and hardness.

The most dramatic results were observed on OSG films wherein UV exposure is preceded by a thermal anneal at 400° C. In these films, the increase in hardness is more substantial with only a slight increase in the dielectric constant. Reducing the temperature of thermal anneal temperature to 375° C., lessens the increase in hardness but maintains or decreases the dielectric constant. It is believed that this may be attributable to the major loss of alkoxy groups at a temperature ranging from 375° C. to 400° C. The removal of the alkoxy groups may allow the films to be more receptive towards hardness enhancement by exposure to UV radiation.

TABLE III

Comparison of Deposition Temperature on Dense DEMS OSG Films

| Deposition Temp. | | Thickness Loss | Refractive Index | Dielectric Constant | Modulus (GPa) | Hardness (GPa) |
|---|---|---|---|---|---|---|
| 150° C. | As Deposited | N/A | 1.433 | 3.06 | 3.07 | 0.48 |
| 150° C. | Thermal (375° C.) | −1% | 1.395 | N/A | N/A | N/A |
| 150° C. | Thermal (400° C.) | −1% | 1.403 | N/A | N/A | N/A |
| 150° C. | Thermal (425° C.) | −4% | 1.384 | 2.79 | 5.34 | 0.94 |
| 150° C. | Thermal (375° C.) + UV | −16% | 1.398 | 2.82 | 12.18 | 1.93 |
| 150° C. | Thermal (400° C.) + UV | −16% | 1.400 | 2.77 | 11.97 | 2.03 |
| 150° C. | UV | −6% | 1.397 | 2.69 | 4.49 | 0.72 |
| 200° C. | As Deposited | N/A | 1.432 | 2.96 | 4.99 | 0.86 |
| 200° C. | Thermal (375°) | −1% | 1.395 | N/A | N/A | N/A |
| 200° C. | Thermal (400°) | −1% | 1.403 | N/A | N/A | N/A |
| 200° C. | Thermal (425°) | −2% | 1.402 | 2.81 | 5.33 | 0.92 |
| 200° C. | Thermal (375° C.) + UV | −5% | 1.402 | 2.79 | 7.48 | 1.19 |
| 200° C. | Thermal (400° C.) + UV | −15% | 1.411 | 2.87 | 15.10 | 2.49 |
| 200° C. | UV | −1% | 1.417 | 2.83 | 4.78 | 0.80 |
| 250° C. | As Deposited | N/A | 1.411 | 3.00 | 5.55 | 0.84 |
| 250° C. | Thermal (375°) | −1% | 1.414 | N/A | N/A | N/A |
| 250° C. | Thermal (400°) | −1% | 1.423 | N/A | N/A | N/A |
| 250° C. | Thermal (425° C.) | −1% | 1.408 | 2.90 | 7.42 | 1.30 |
| 250° C. | Thermal (375° C.) + UV | −5% | 1.395 | 2.92 | 8.19 | 1.33 |
| 250° C. | Thermal (400° C.) + UV | −15% | 1.433 | 3.03 | 22.66 | 3.2 |
| 250° C. | UV | −1% | 1.413 | 2.85 | 7.51 | 1.29 |
| 300° C. | As Deposited | N/A | 1.433 | 3.00 | 10.30 | 1.80 |
| 300° C. | Thermal (375°) | −1% | 1.420 | N/A | N/A | N/A |
| 300° C. | Thermal (400°) | −1% | 1.427 | N/A | N/A | N/A |
| 300° C. | Thermal | −1% | 1.430 | 3.01 | 10.90 | 1.94 |
| 300° C. | Thermal (375° C.) + UV | −2% | 1.420 | 2.99 | 11.68 | 1.90 |
| 300° C. | Thermal (400° C.) + UV | −12% | 1.419 | 3.21 | 25.48 | 3.56 |
| 300° C. | UV | −1% | 1.407 | 2.99 | 12.58 | 2.15 |
| 350° C. | As Deposited | N/A | 1.440 | 3.12 | 15.43 | 2.65 |
| 350° C. | Thermal (375°) | 0% | 1.440 | N/A | N/A | N/A |
| 350° C. | Thermal (400°) | 0% | 1.433 | N/A | N/A | N/A |
| 350° C. | Thermal | 0% | 1.442 | 3.09 | 15.93 | 2.68 |
| 350° C. | Thermal (375° C.) + UV | −2% | 1.442 | 3.05 | 18.33 | 2.87 |
| 350° C. | Thermal (400° C.) + UV | −8% | 1.462 | 3.28 | 28.96 | 4.00 |
| 350° C. | UV | −2% | 1.446 | 3.05 | 17.78 | 2.94 |
| 425° C. | As Deposited | N/A | 1.479 | 3.34 | 26.05 | 4.17 |
| 425° C. | Thermal (375° C.) | 0% | 1.461 | N/A | N/A | N/A |
| 425° C. | Thermal (400° C.) | 0% | 1.475 | N/A | N/A | N/A |
| 425° C. | Thermal | 0% | 1.479 | 3.32 | 26.61 | 4.18 |
| 425° C. | Thermal (375° C.) + UV | −2% | 1.472 | 3.30 | 31.73 | 4.54 |
| 425° C. | Thermal (400° C.) + UV | −3.5% | 1.473 | 3.42 | 33.50 | 4.76 |
| 425° C. | UV | −2% | 1.474 | 3.27 | 30.09 | 4.59 |

Examples 7 and 8

Formation of a Dense OSG Film Using 1,3,5,7-Tetramethylcyclotetrasiloxane (TMCTS) at Various Substrate Temperatures Organosilicate glass films were formed onto a silicon wafers via PECVD of 750 mg/min of the structure-former precursor TMCTS with 500 sccm of a helium carrier gas. The depositions were performed at 6 torr, 300 W plasma power, and 320 mils spacing. The wafer temperature during deposition was maintained at 350° C. or 425° C. The deposition rate of the film was 990 nm/minute at 350° C. and 710 nm/min at 425° C.

The properties of the TMCTS OSG films after deposition (examples 7a and 8a) and after exposure to a UV light source (examples 7b and 8b) are provided in Table IV. The substrate temperature during the deposition process has a direct effect on the hardness of the TMCTS films. Additionally, a lower dielectric constant is obtained with a higher substrate temperature, indicating clearly that the overall film properties of TMCTS-based OSG materials may improve as the temperature of the substrate is raised. Comparing these same films after UV exposure (examples 7b and 8b), the dielectric constants, mechanical modulus, and hardness are nearly identical. This suggests that the UV exposure step may be modifying the chemical structure of the OSG film such that the direct relationship between dielectric constant and hardness is optimized. The degree of reorganization required is illustrated by the thickness loss of the film. When the deposition temperature is 350° C., the film loses 9% thickness upon exposure to UV light; whereas when the deposition temperature is 425° C. the film thickness decreases by only 3%.

Depending on the application, OSG films used as interlayer dielectric materials can be deposited on a variety of substrates. Because many substrates such as polymeric materials may lose their material integrity at semiconductor processing temperatures, or for thermal budget reasons, it may be advantageous to expose the OSG film to UV because the exposure can be conducted at relatively lower temperatures and the dielectric insulating characteristics are retained. The data in Table IV illustrates that an interlayer dielectric material deposited at a lower temperatures can be modified by exposure to UV radiation to dramatically improve its overall properties. This change is obtained at modest temperatures and without the addition of chemical precursors, and thus, is applicable to a wide variety of applications.

Examples 9 and 10

Formation of a Porous OSG Film Using 1-Neohexyl-1,3,5,7-tetramethyl-cyclotetrasiloxane (NH-TMCTS) at Varying Temperatures Organosilicate glass films were formed on silicon wafers via PECVD of 500 mg/min of the structure/pore former precursor NH-TMCTS with $CO_2$ as the carrier gas at a flow rate of 200 sccm. The deposition was performed at 8 torr, 300 W plasma power, and 300 mils spacing. The wafer temperature during deposition was maintained at either 280° C. (examples 9a, 9b, and 9c) or 350° C. (examples 10a, 10b, and 10c). The deposition rate of the film was 625 nm/minute for the films deposited at 280° C. and 420 nm/minute for films deposited at 350° C.

The properties of the OSG film after deposition (example 9a), after thermal anneal (example 9b), and after exposure to a UV light source (example 9c) are provided in Table V. As Table V illustrates, films 9b and 9c, which were thermally annealed and exposed to UV light respectively, exhibited a change in dielectric constant relative to example 9a. While film 9c experienced an increase in dielectric constant, it also exhibited a significant increase in modulus and hardness, or approximately 91% and 137%, respectively, from example 9a. Example 9b, by contrast, exhibited an decrease in modulus and hardness compared with example 9a. Thus, the UV exposure step provides a significant improvement in the mechanical properties of the OSG glass film relative to thermal post-treatment while using milder processing conditions.

The properties of the OSG film after deposition (Example 10a), after thermal anneal (Example 10b), and after exposure to a UV light source (Example 10c) are provided in Table V. As Table V illustrates, films 10b and 10c, which were thermally annealed and exposed to UV light respectively, both exhibited a slight increase of 0.06 in dielectric constant relative to example 10a. However, film 10c exhibited a significant increase in modulus and hardness, or an approximately 57% and 88% increase in hardness, from example 10a. Example 10b, by contrast, exhibited an approximately 4.1% increase in modulus and approximately 7.8% increase in hardness from example 10a. Thus, the UV exposure step provides a significant improvement in the mechanical properties of the OSG glass film relative to thermal post-treatment while using milder processing conditions.

TABLE IV

Comparison of TMCTS Dense OSG Films deposited at various temperatures before and after UV exposure (15 minutes under vacuum).

| Ex. | Precursor | | Deposition Temperature | Thickness Loss (%) | Refractive Index | Dielectric Constant | Modulus (GPa) | Hardness (GPa) |
|---|---|---|---|---|---|---|---|---|
| 7a | TMCTS | As Dep'd | 350° C. | N/A | 1.385 | 3.03 | 6.75 | 1.10 |
| 7b | TMCTS | UV | " | −9 | 1.396 | 2.91 | 10.49 | 1.78 |
| 8a | TMCTS | As Dep'd | 425° C. | N/A | 1.388 | 2.86 | 9.07 | 1.49 |
| 8b | TMCTS | UV | " | −3 | 1.402 | 2.93 | 10.50 | 1.74 |

TABLE V

Comparison of NH-TMCTS Porous OSG Films deposited at various temperatures before and after UV exposure (15 minutes under vacuum).

| Example | Precursor | Dep. Temp | | Thickness Loss (%) | Refractive Index | Dielectric Constant | Modulus (GPa) | Hardness (GPa) |
|---|---|---|---|---|---|---|---|---|
| 9a | NH-TMCTS | 280° C. | As Deposited | N/A | 1.406 | 2.66 | 3.09 | 0.41 |
| 9b | NH-TMCTS | 280° C. | Thermal | −2 | 1.381 | 2.54 | 2.64 | 0.35 |
| 9c | NH-TMCTS | 280° C. | UV | −14 | 1.383 | 2.70 | 5.90 | 0.97 |
| 10a | NH-TMCTS | 350° C. | As Deposited | N/A | 1.409 | 2.63 | 4.82 | 0.64 |
| 10b | NH-TMCTS | 350° C. | Thermal | −3 | 1.400 | 2.69 | 5.02 | 0.69 |
| 10c | NH-TMCTS | 350° C. | UV | −6 | 1.399 | 2.69 | 7.55 | 1.20 |

Example 11

Formation of a Porous OSG Film Using Neohexyl-Diethoxymethylsilane (NH-DEMS)

An organosilicate glass film was formed onto a silicon wafer via PECVD of 500 mg/min of the structure/pore former precursor NH-DEMS with 150 sccm of a helium carrier gas. The deposition was performed at 10 torr, 400 W plasma power, and 300 mils spacing. The wafer temperature during deposition was maintained at 250° C. The deposition rate of the film was 200 nm/minute.

The properties of the OSG film after deposition (example 11a), after thermal annealing (example 11b), and after exposure to a UV light source (example 11c) are provided in Table VI. The dielectric constant of the thermally annealed film decreases by 0.05 or 3%. Likewise, its mechanical modulus and hardness decrease by 0.62 GPa or 19% and 0.08 GPa or 18%, respectively. Conversely, exposure of the film to a UV light source raises each of the dielectric constant by 0.07 or 3%, modulus by 10.03 GPa or 305%, and the hardness by 1.97 GPa or 338%. Thus, UV exposure provides for significant enhancement of the mechanical properties of the film at milder process conditions and with only a small increase in the dielectric constant.

Example 12

Formation of a Porous OSG Film Using Neohexyl-Diethoxymethylsilane (NH-DEMS)

An organosilicate glass film was formed onto a silicon wafer via PECVD of 500 mg/min of the structure/pore former precursor NH-DEMS with 150 sccm of a helium carrier gas. The deposition was performed at 8 torr, 500 W plasma power, and 400 mils spacing. The wafer temperature during deposition was maintained at 250° C. The deposition rate of the film was 240 nm/minute.

The properties of the OSG film after deposition (example 12a) and after exposure to a UV light source (example 12b) are provided in Table VI. As Table VI illustrates, the UV post-treatment improved the modulus and hardness of the film by approximately 206% and 236%, respectively, whereas the dielectric constant increased by only 6%.

TABLE VI

Comparison of NH-DEMS Porous OSG Films before and after UV exposure (15 minutes under vacuum).

| Example | Precursor | | Thickness Loss (%) | Refractive Index | Dielectric Constant | Modulus (GPa) | Hardness (GPa) |
|---|---|---|---|---|---|---|---|
| 11a | NH-DEMS | As Deposited | N/A | 1.437 | 2.61 | 3.29 | 0.45 |
| 11b | NH-DEMS | Thermal | −3 | 1.391 | 2.56 | 2.67 | 0.37 |
| 11c | NH-DEMS | UV | −26 | 1.385 | 2.68 | 13.32 | 1.97 |
| 12a | NH-DEMS | As Deposited | N/A | 1.436 | 2.70 | 4.88 | 0.66 |
| 12b | NH-DEMS | UV | −23 | 1.391 | 2.81 | 14.93 | 2.22 |

Example 13

Formation of a Porous OSG Film Using Diethoxymethylsilane (DEMS), Triethoxysilane (TES), and Alpha-terpinene (ATRP)

An organosilicate glass film was formed onto a silicon wafer via PECVD of 210 mg/min of a 50/50 mixture of the structure-former precursors DEMS and TES, 490 mg/min of the pore-former ATRP, 200 sccm of $CO_2$ and 25 sccm $O_2$. The deposition was performed at 8 torr, 600 W plasma power, and 350 mils spacing. The wafer temperature during deposition was maintained at 300° C. The deposition rate of the film was 275 nm/minute.

The properties of the OSG film after deposition (example 13a), after thermal anneal (example 13b), and after exposure to a UV light source (example 13c) are provided in Table VII. As Table VII illustrates, both the thermal and UV post-treatment lowered the dielectric constant. However, the UV post-treatment lowered the dielectric constant by a greater degree, approximately 25% compared to the thermal post-treatment which lowered the dielectric constant bye approximately 12%. Further, the UV post-treatment increased the modulus and the hardness of the film by approximately 2% and approximately 10%, respectively, whereas the thermal post-treatment decreased the modulus and the hardness of the film by approximately 41% and 26% respectively. The UV exposure step clearly provides superior properties compared to the thermal post-treated films at milder conditions.

Example 14

Deposition of Porous OSG Films Using Structure-former 1,3-dimethyl-1,3-diethoxy-disiloxane (MEDS) and Pore Former alpha-terpinene (ATRP)

An organosilicate glass film was formed onto a silicon wafer via PECVD of 400 mg/min of the structure-former precursor MEDS, 600 mg/min of the pore-former precursor ATRP with 250 sccm of a $CO_2$ carrier gas. The deposition was performed at 8 torr, 600 W plasma power, and 350 mils spacing. The wafer temperature during deposition was maintained at 300° C. The deposition rate of the film was 280 nm/minute.

The properties of the OSG film after deposition (example 14a), after thermal annealing (example 14b), and after exposure to a UV light source (example 14c) are provided in Table VII. As Table VII illustrates, the UV post-treatment increased the hardness of the film by approximately 46% compared to approximately 1% increase in the thermal annealed film. Further, the UV post-treatment step increased the modulus of the film by approximately 37% whereas the thermal annealing post-treatment step decreased the modulus by approximately 4%.

Figure 3:
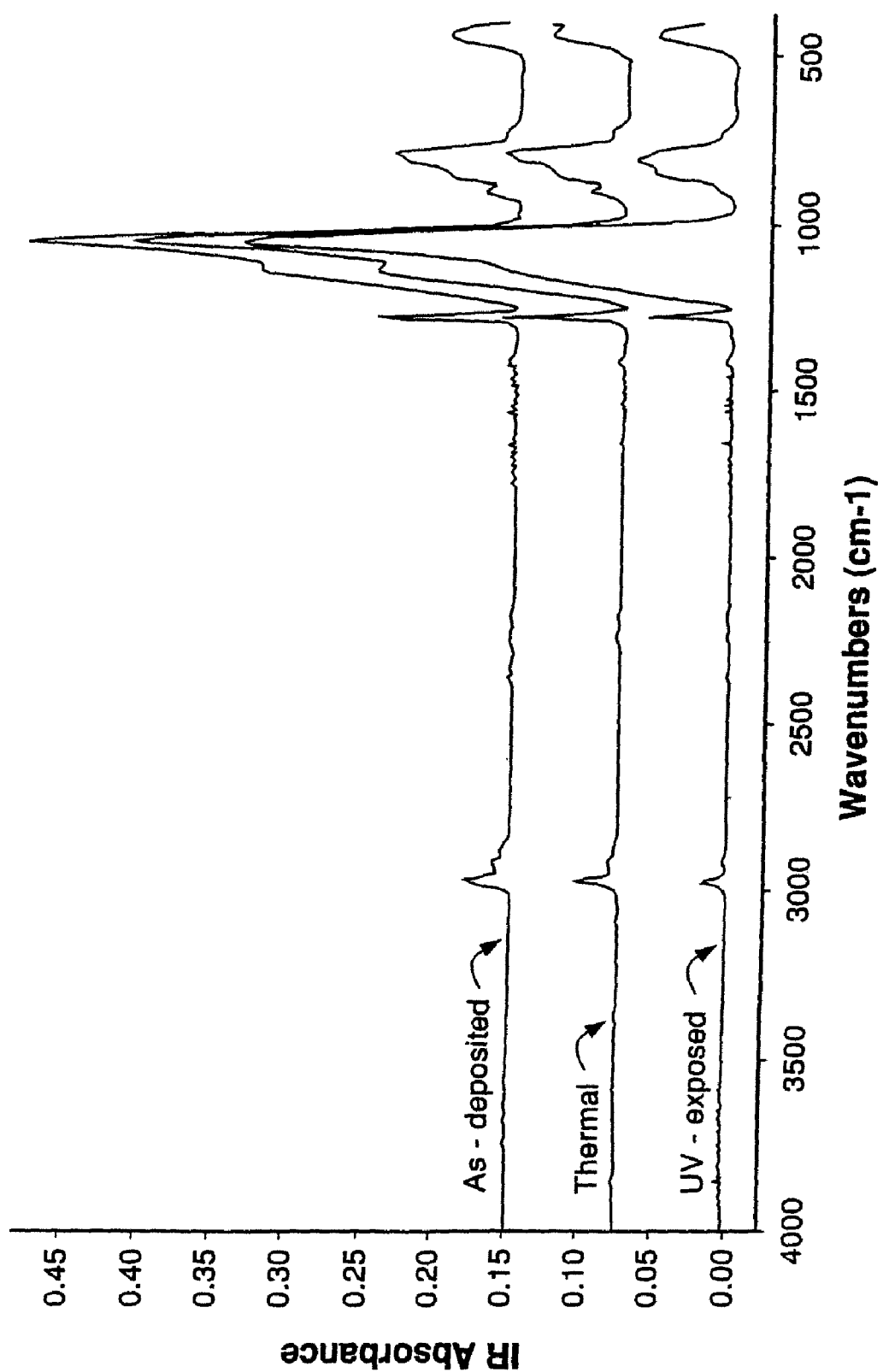
FIG. 3 provides the IR absorption spectrum for an as-deposited, thermally annealed, and UV exposed porous OSG glass film deposited using a MEDS structure-former precursor and an ATRP pore-former precursor.

FIG. 3 provides the IR absorption spectrum for each film. As FIG. 3 illustrates, at the 1160-1180 nm wavelengths, the absorbance attributed to Si—O bonding progresses from a double-peak in the as-deposited and thermally annealed films to a single peak with a slight shoulder for the UV-exposed film. This may be attributed to the effect that the UV exposure has on the network of the porous OSG film.

TABLE VII

Film Properties for various Porous OSG materials

| Example | Precursor | | Thickness Loss (%) | Refractive Index | Dielectric Constant | Modulus (GPa) | Hardness (GPa) |
|---|---|---|---|---|---|---|---|
| 13a | DEMS/TES/ATRP | As Deposited | N/A | 1.482 | 3.00 | 8.17 | 1.00 |
| 13b | DEMS/TES/ATRP | Thermal | 0 | 1.351 | 2.77 | 5.79 | 0.74 |
| 13c | DEMS/TES/ATRP | UV | −8 | 1.345 | 2.51 | 8.30 | 1.10 |
| 14a | MEDS/ATRP | As Deposited | N/A | 1.421 | 2.76 | 6.62 | 1.06 |
| 14b | MEDS/ATRP | Thermal | 0 | 1.397 | 2.72 | 6.37 | 1.07 |
| 14c | MEDS/ATRP | UV | −7 | 1.386 | 2.75 | 9.08 | 1.55 |

Example 15

Deposition of Porous OSG Films Using Diethoxymethylsilane (DEMS) and Alpha-Terpinene (ATRP)

An organosilicate glass film was formed onto a silicon wafer via PE-CVD of 210 mg/min of the structure-former precursor DEMS, 490 mg/min of the pore-former precursor ATRP, with 200 sccm of a $CO_2$ carrier gas and 25 sccm of an oxygen additive. The deposition was performed at 8 torr, 750 W plasma power, and 350 mils spacing. The wafer temperature during deposition was maintained at 300° C. The deposition rate of the film was 460 nm/minute.

The properties of the OSG film after deposition (example 15a), after thermal annealing (example 15b), and after exposure to a UV light source (example 15c) are provided in Table VIII. As Table VIII illustrates, both the thermal and UV post-treatment lower the dielectric constant but UV exposure lowers the dielectric constant to a greater degree. UV exposure improved the modulus and hardness of the film whereas thermal annealing decreased the modulus and hardness. Thus, UV exposure clearly provides a superior combination of a lower dielectric constant and higher hardness compared with the thermally annealed sample at relatively milder process conditions.

FIG. 4 provides the UV/visible absorption spectrum of the as-deposited porous DEMS/ATRP film. As FIG. 4 illustrates, this material has an appreciable absorption in the region of the spectrum between 190 and 280 nm. The structure of the spectrum clearly indicate two distinct maxima, the first of which is centered at approximately 268 nm, and the second at 193 nm. The lower energy absorption is likely from the ATRP pore-former precursor, while the higher intensity and energy absorption likely arises from the DEMS network forming precursor.

Figure 5:
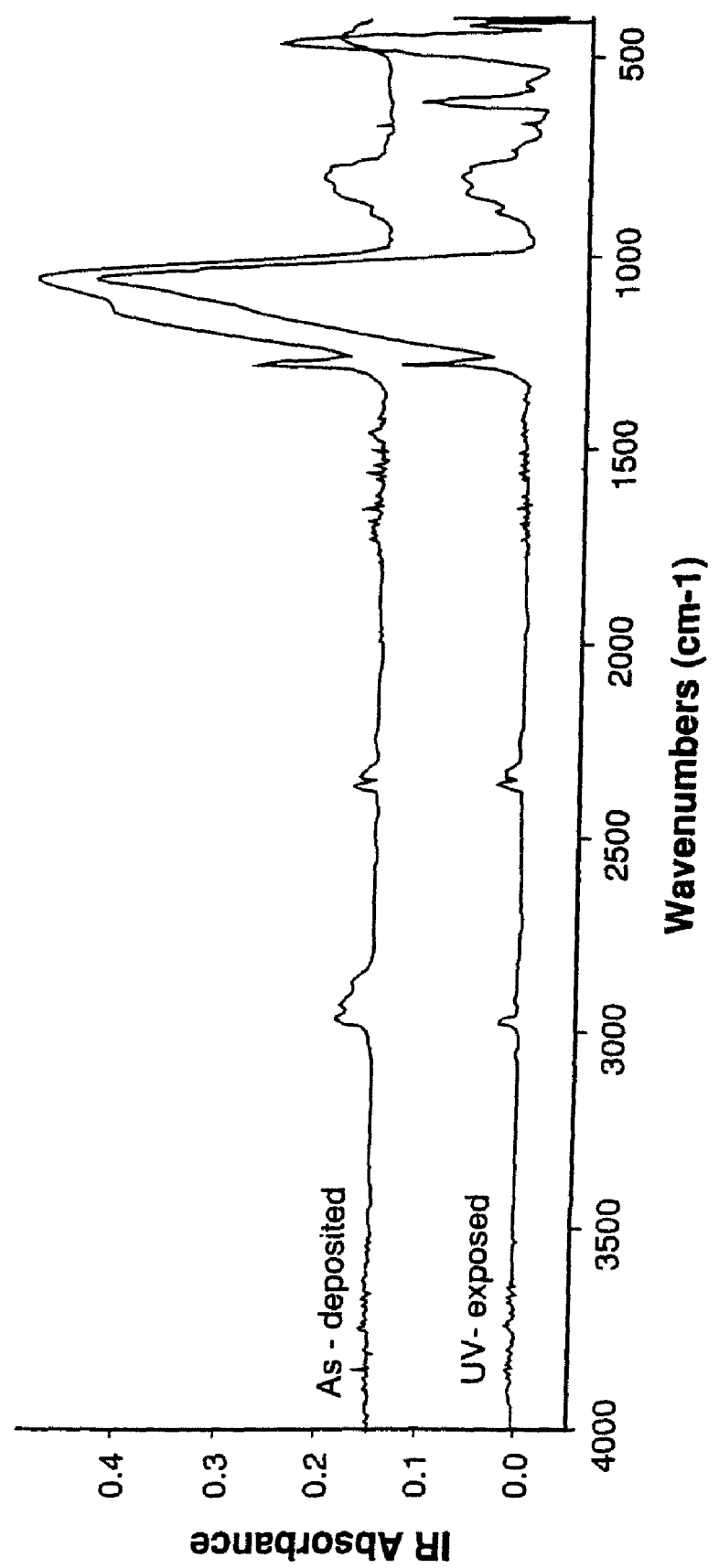
FIG. 5 provides the IR absorption spectrum for a porous OSG glass film deposited using a DEMS structure-former precursor and an ATRP pore-former precursor before and after UV exposure.

FIG. 5 provides the IR absorption spectrum of the as-deposited porous DEMS/ATRP film, Example 15a, as well as that of the film exposed to a UV light source, Example 15c. As FIG. 5 illustrates, at the 1160-1180 nm wavelengths, the absorbance attributed to Si—O bonding progresses from a double-peak in the as-deposited and thermally annealed films to a single peak with a slight shoulder for the UV-exposed film. This may be attributed to the effect that the UV exposure has reducing the Si—O bonding associated with cage-like structures and introducing a higher degree of network-like Si—O bonds that are reflected in the increased hardness.

TABLE VIII

Comparison of Properties of Various Porous OSG Films Before and After UV Exposure

| Example | Precursor | | Thickness Loss | Refractive Index | Dielectric Constant | Modulus (GPa) | Hardness (GPa) |
|---|---|---|---|---|---|---|---|
| 15a | DEMS/ATRP | As Deposited | N/A | 1.482 | 2.98 | 3.74 | 0.48 |
| 15b | DEMS/ATRP | Thermal | −2% | 1.363 | 2.55 | 3.17 | 0.40 |
| 15c | DEMS/ATRP | UV | −11% | 1.345 | 2.29 | 4.73 | 0.57 |

Examples 16 and 17

Effect of Thermal Treatment Pre- and Post-UV Exposure

A porous DEMS-based OSG film was deposited by PE-CVD followed by thermal anneal at 425° C. and/or UV exposure. Precursors DEMS (210 mg/min), aTRP (490 mg/min), an oxygen additive (25 sccm), and $CO_2$ carrier gases (200 sccm) were introduced into the deposition chamber and deposited with plasma power of 600 W, spacing of 350 mils and a chamber pressure of 8 torr. The wafer temperature was 300° C. The deposition rate was 240 nm/min. The film properties of the as-deposited film (example 16a), thermal annealed film (example 16b), thermal annealed then UV exposed film (example 16c), and UV exposed film (example 16d) are provided in Table IX.

A porous DEMS-based OSG film was deposited by PE-CVD followed by thermal anneal at 425° C. and/or UV exposure. Precursors DEMS (210 mg/min), aTRP (490 mg/min), an oxygen additive (25 sccm), and $CO_2$ carrier gases (200 sccm) were introduced into the deposition chamber and deposited with plasma power of 450 W, spacing of 350 mils and a chamber pressure of 6 torr. The wafer temperature was 300° C. The deposition rate was 175 nm/min. The film properties of the as-deposited film (example 17a), thermal annealed film (example 17b), thermal annealed then UV exposed film (example 17c), UV exposed film (example 17d), and UV exposed then thermal annealed film (example 17e) are provided in Table VI.

Examples 1-15 have shown that UV exposure is superior to thermal annealing for both lowering the dielectric constant and improving the material hardness in a single post-treatment processing step for both dense and porous OSG materials. Examples 16 and 17 illustrate that thermal annealing and exposure to a UV light source can be used in sequence to improve the properties of porous OSG films to an even greater degree than UV exposure alone. In particular it should be noted that films subjected to thermal annealing alone, examples 16b and 17b, exhibited a decrease in material hardness by 9% and 11%, respectively, relative to the as-deposited films. On the other hand, the mechanical hardness of examples 16d and 17d was observed to increase by 5% and 7%, respectively, relative to the as-deposited films. Comparing examples 16b with 16d and 17b with 17d illustrates again that exposure to UV radiation is a superior method for both increasing the hardness and decreasing the dielectric constant of porous OSG films.

Examples 16c and 17c demonstrate that the use of thermal annealing and UV exposure steps in sequence can be used to enhance the material properties to an even greater degree than UV exposure alone. The results clearly show that the porous OSG material formed after thermal annealing is still susceptible to treatment by exposure to UV light to enhance its materials properties. Conversely, a film exposed to UV light is stable to thermal annealing, as evidenced by the similarity between examples 17d and 17e.

TABLE IX

Comparison of Properties of Various Porous OSG Films Before and After UV Exposure

| Example | Precursor | | Thickness Loss (5%) | Refractive Index | Dielectric Constant | Modulus (GPa) | Hardness (GPa) |
|---|---|---|---|---|---|---|---|
| 16a | DEMS/ATRP | As Deposited | N/A | 1.458 | 2.74 | 5.87 | 0.86 |
| 16b | DEMS/ATRP | Thermal | 0 | 1.350 | 2.48 | 4.89 | 0.74 |
| 16c | DEMS/ATRP | Thermal + UV | −10 | 1.354 | 2.40 | 7.42 | 1.07 |
| 16d | DEMS/ATRP | UV | −4 | 1.338 | 2.44 | 6.64 | 0.90 |
| 17a | DEMS/ATRP | As Deposited | N/A | 1. | 2.79 | 4.89 | 1.05 |
| 17b | DEMS/ATRP | Thermal | 0 | 1.366 | 2.61 | 5.87 | 0.93 |
| 17c | DEMS/ATRP | Thermal + UV | −6 | 1.348 | 2.57 | 3.74 | 1.55 |

TABLE IX-continued

Comparison of Properties of Various Porous OSG Films Before and After UV Exposure

| Example | Precursor | | Thickness Loss (5%) | Refractive Index | Dielectric Constant | Modulus (GPa) | Hardness (GPa) |
|---|---|---|---|---|---|---|---|
| 17d | DEMS/ATRP | UV | −3 | 1.339 | 2.56 | 3.17 | 1.12 |
| 17e | DEMS/ATRP | UV + Thermal | −4 | 1.331 | 2.55 | 4.73 | 1.03 |

Example 18

Deposition of Porous OSG Films Using Diethoxymethylsilane (DEMS) and Alpha-terpinene (ATRP)

Exemplary porous OSG films were formed onto a silicon wafer via PE-CVD of 210 mg/min of the structure-former precursor DEMS, 490 mg/min of the pore-former precursor ATRP, with 200 sccm of a $CO_2$ carrier gas and 25 sccm of an oxygen additive. The deposition was performed at 8 torr, 750 W plasma power, 350 mils spacing, and a liquid flow of 675 mg/min. The wafer temperature during deposition was maintained at 300° C. The deposition rate of the film was 460 nm/minute.

The films were exposed to ultraviolet light under either a vacuum atmosphere of about 5 millitorr (example 18a) or under a nitrogen atmosphere having a flow rate of 800 sccm at ambient pressure (example 18b). FIGS. 6a and 6b provide the dielectric constant and refractive index versus UV exposure time for examples 18a and 18b, respectively.

FIGS. 6a and 6b show that the exposure to UV light removes the pore-former precursor ATRP under either the vacuum or nitrogen atmosphere at ambient pressure within the first couple of minutes of exposure. This is shown by the drop in both dielectric constant and refractive index for both exemplary films 18a and 18b.

Figure 9:
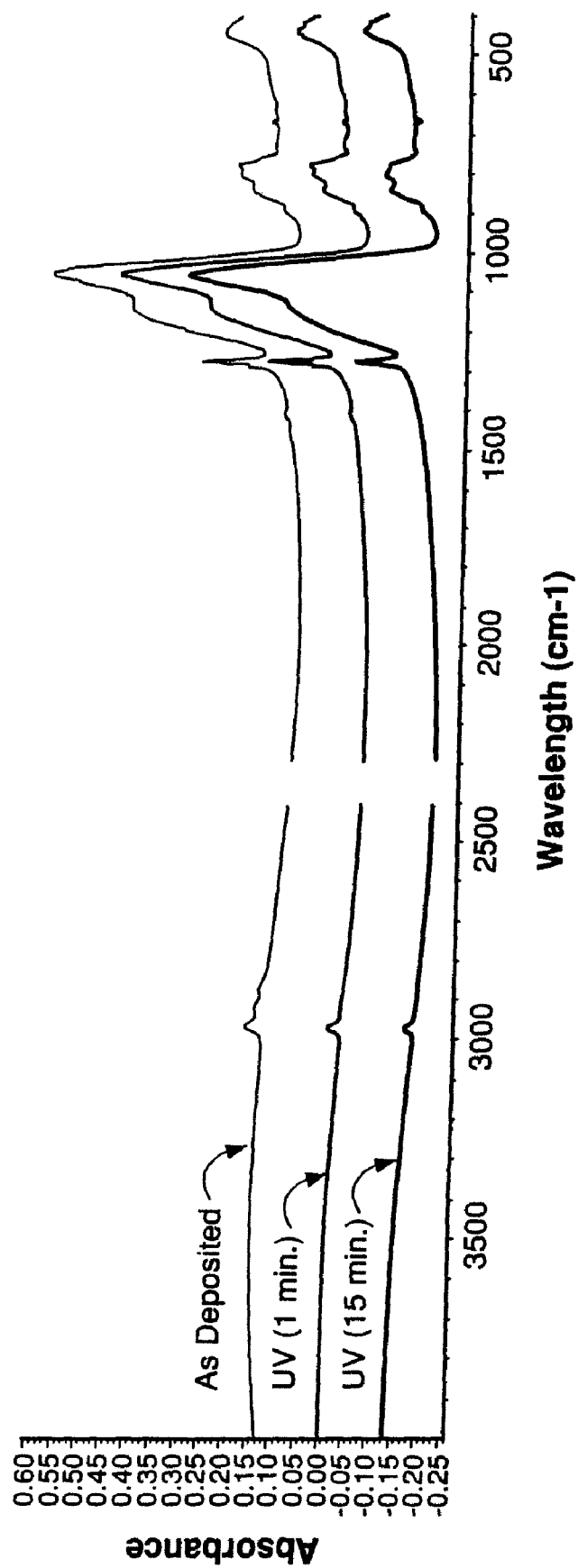
FIG. 9 provides the IR absorption spectrum for a porous OSG film deposited using a DEMS structure-former precursor and an ATRP pore-former precursor after deposition and after exposure to UV light in a vacuum atmosphere for 1 minute and 15 minutes.

Examination of the infrared spectra in FIG. 9 shows a dramatic decrease in the C—$H_x$ absorption region near 2900 $cm^{-1}$ after the first minute of UV exposure. However, there is noticeably little change in other regions of the spectrum after one minute of UV exposure. Further, there was observed minimal film shrinkage evident during the pore-former removal process.

Figure 7:
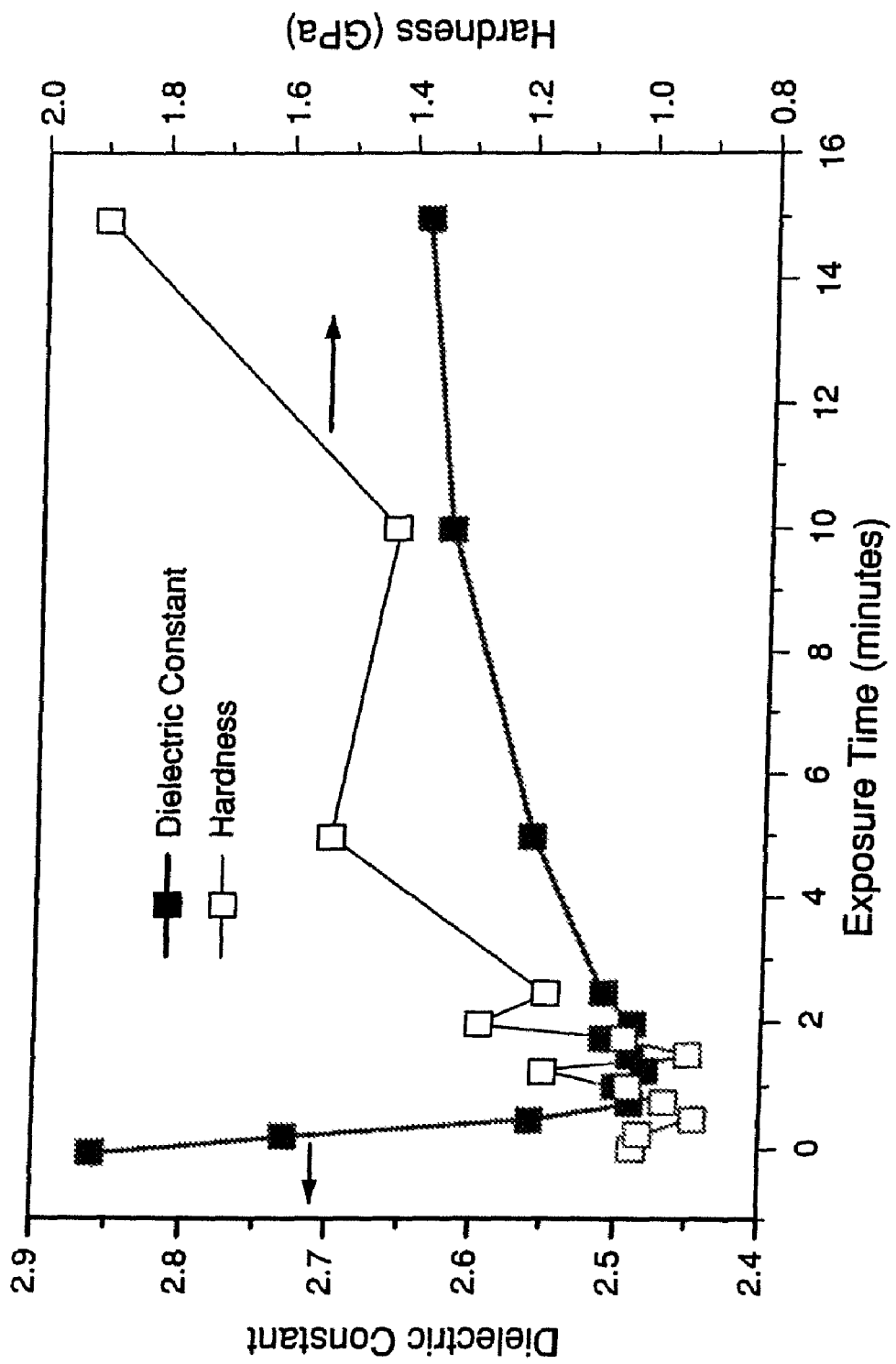
FIG. 7 provides the dielectric constant and hardness (GPa) versus UV exposure time for a film deposited using a DEMS structure-former precursor and an ATRP pore-former precursor under vacuum atmosphere (5 millitorr).

FIG. 7 and Table X show that the mechanical hardness of the film decreased by approximately 10% within the first couple of minutes of UV exposure in a vacuum atmosphere. It was observed that the onset of film hardening occurs under continued exposure to UV light after 2 minutes, or after removal of the pore-former precursor, and saturates after approximately 15 minutes for the lamp power and spectral output configuration.

Figure 8:
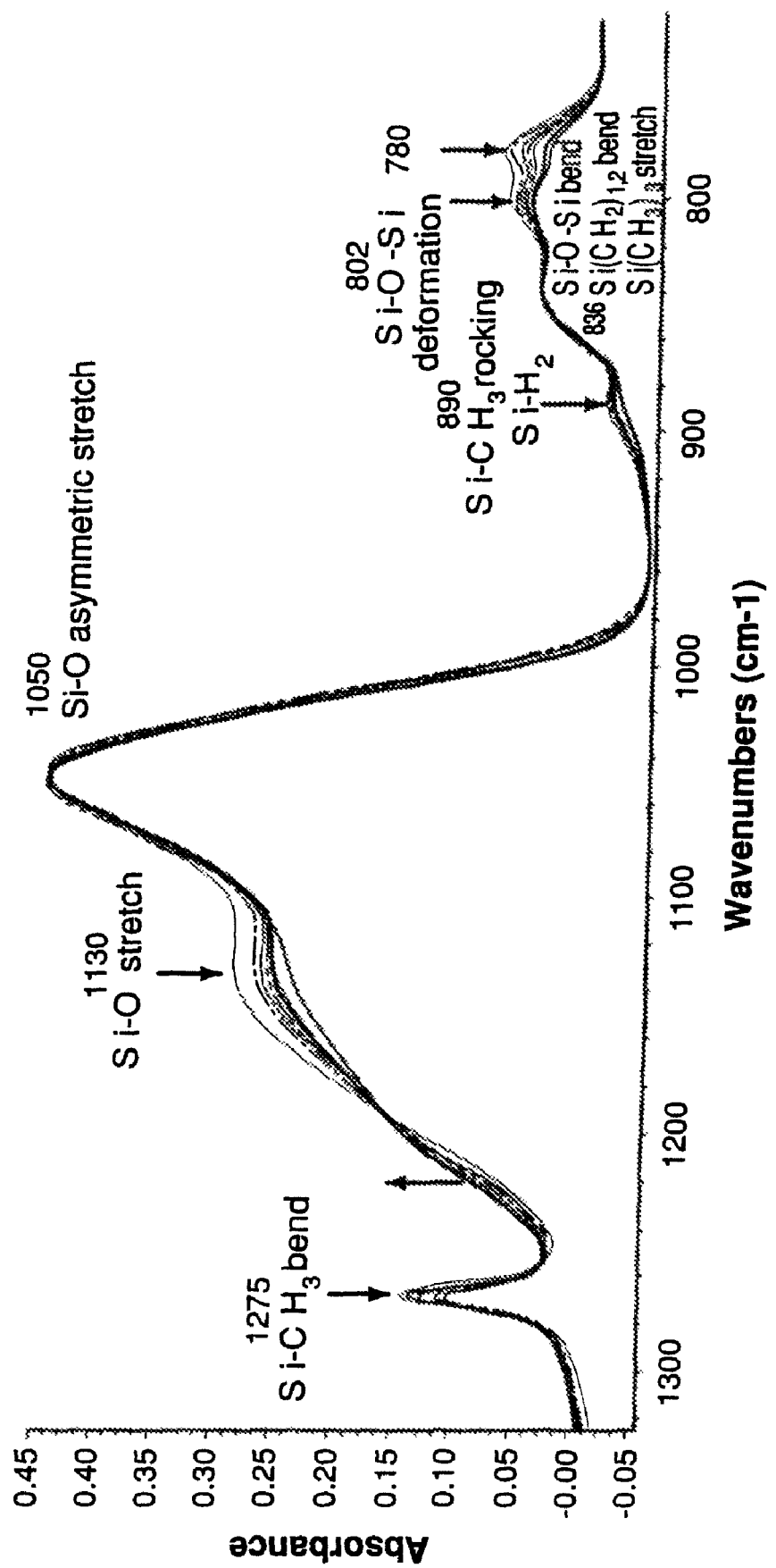
FIG. 8 illustrates the changes in the IR absorption spectrum for wavelengths ranging between 700 and 1350 cm-1 for a porous OSG glass film deposited using a DEMS structure-former precursor and an ATRP pore-former precursor upon UV exposure under a vacuum atmosphere and for a duration ranging from 0 to 20 minutes.

Referring to FIGS. 8 and 9, the IR spectra also confirm evidence of the hardening process shown in FIG. 9 upon removal of the pore-former precursor. An evolution of the Si—O region from a double peak to a single major peak with a shoulder occurs during initial UV exposure. The two areas of the Si—O region (1130 $cm^{-1}$ and 1060 $cm^{-1}$) are typical of cage-like and networked silicate, respectively. Increase in the former may be characteristic of a silicate doped with terminal groups, whereas increases in the latter may be more typical of a highly networked oxide. The evolution of the OSG film from a cage-to-network silicate is typical for processes that increase the mechanical strength. Further, FIGS. 8 and 9 also show decreases in methyl stretching and bending modes as well as loss of Si—H.

The chemical composition determined by x-ray photoelectron spectroscopy for an exemplary OSG 18a films after 1 minute and 15 minutes exposure under vacuum are provided in Table XI. The data shows that the carbon concentration decreases by 48% within the first minute of UV exposure consistent with the loss of the pore-former precursor from the film. However, during the hardening process, there is little change in the overall composition of the film despite the 100% increase in hardness and modulus. It is believed that these increases are a result in a change to the structure of the film. Hydrogen concentration (not shown) may also decrease significantly. Consequently, it is believed that the major gas species evolved from UV exposure between 1 and 15 minutes are hydrogen-containing species.

TABLE X

Change in film properties for Exemplary OSG film 18a deposited from DEMS and ATRP upon exposure to UV light under vacuum.

| Time (seconds) | Refractive Index | Dielectric Constant | Modulus (GPa) | Hardness (GPa) | Thickness Loss (%) |
|---|---|---|---|---|---|
| 0 | 1.444 | 2.86 | 6.91 | 1.01 | N/A |
| 15 | 1.438 | 2.73 | 6.79 | 1.00 | 0 |
| 30 | 1.358 | 2.56 | 5.88 | 0.91 | 0 |
| 45 | 1.344 | 2.49 | 6.01 | 0.96 | −1 |
| 60 | 1.344 | 2.50 | 6.29 | 1.02 | −2 |
| 75 | 1.344 | 2.48 | 7.13 | 1.16 | −3 |
| 90 | 1.350 | 2.49 | 6.29 | 0.92 | −4 |
| 105 | 1.342 | 2.51 | 6.59 | 1.03 | −4 |
| 120 | 1.350 | 2.49 | 8.11 | 1.27 | −4 |
| 150 | 1.347 | 2.51 | 7.38 | 1.16 | −4 |
| 300 | 1.363 | 2.56 | 9.47 | 1.52 | −9 |
| 600 | 1.360 | 2.62 | 8.7 | 1.42 | −9 |
| 900 | 1.373 | 2.64 | 12.2 | 1.9 | −12.5 |
| 1200 | 1.380 | 2.72 | 11.8 | 1.9 | −12.5 |

TABLE XI

Properties of DEMS/ATRP films after UV exposure under vacuum for 1 minute (after generation of porosity) and after 15 minutes (after film hardening).

| | Silicon | Oxygen | Carbon | Formula |
|---|---|---|---|---|
| As-Deposited | 30.3 | 38.7 | 31.8 | $SiO_{1.27}C$ |
| 1 min. UV | 35.3 | 47.7 | 17 | $SiO_{1.34}C_{0.5}$ |
| 15 min. UV | 36.4 | 50 | 13.6 | $SiO_{1.37}C_{0.37}$ |

Example 19

Effect of Atmosphere During UV Exposure on Properties of OSG Films

The prior art (US 2003/0054115-A1) provides examples in which UV exposure under oxygen atmosphere is more effective at enhancing the mechanical strength of porous HSQ and MSQ films. Furthermore, there was negligible negative effect on the dielectric constant when UV exposure was performed under oxygen. This differs considerably from experiments on dense and porous OSG films deposited from DEMS and DEMS+ATRP.

An exemplary porous OSG film was formed onto a silicon wafer via PE-CVD of 173 mg/min of the structure-former precursor DEMS, 402 mg/min of the pore-former precursor ATRP, with 200 sccm of a $CO_2$ carrier gas and 25 sccm of an oxygen additive. The deposition of the DEMS/ATRP film was performed at 8 torr, 750 W plasma power and 350 mils spacing. The wafer temperature during deposition was maintained at 300° C. The deposition rate of the film was 340 nm/minute.

Figure 10:
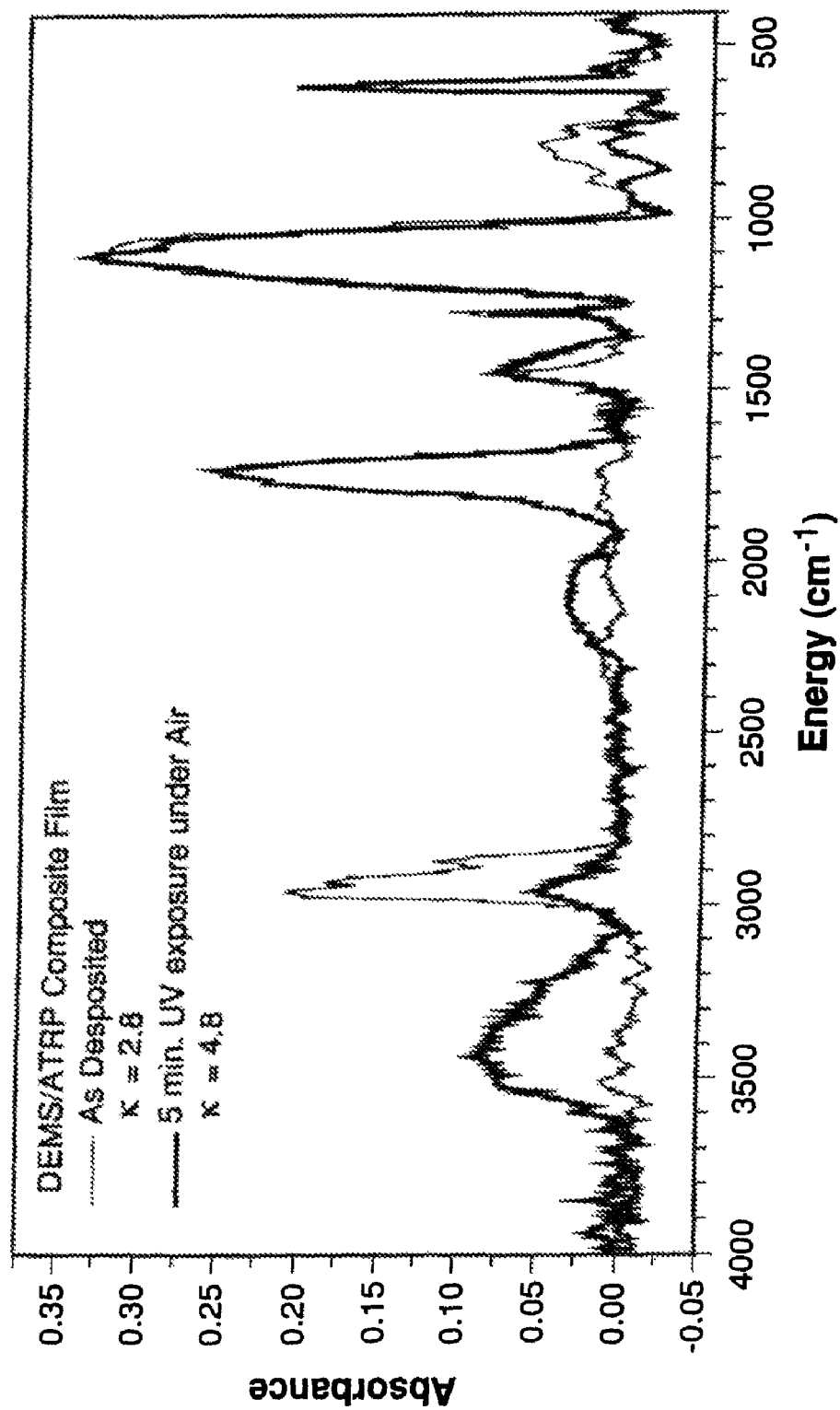
FIG. 10 provides the FT-IR absorption spectrum for a porous OSG glass film deposited using a DEMS structure-former precursor and an ATRP pore-former precursor after deposition and after exposure to UV light and air for 5 minutes.

FIG. 10 and Table XIII illustrates the effect of atmosphere on dielectric constant during UV exposure. The dielectric constant of the as-deposited DEMS/ATRP film was 2.8. The DEMS/ATRP film was subjected to UV exposure for 5 minutes under an air atmosphere to provide a porous DEMS/ATRP film. The dielectric constant of the porous DEMS/ATRP film after UV exposure in an air atmosphere was 4.8.

Dense organosilicate glass films deposited from DEMS or trimethylsilane were exposed to UV light under differing atmospheres. The dense DEMS film was deposited in a manner similar to the films in example 6. The dense trimethylsilane film (3MS) was formed onto a silicon wafer via PE-CVD of 600 sccm 3MS and 100 sccm $O_2$. The deposition of the 3MS films film was performed at 4 torr, 750 W plasma power, and 280 mils spacing. The wafer temperature during deposition was maintained at 350° C. The deposition rate of the film was 600 nm/minute. The dielectric constant of the 3MS film was 3 and the hardness was 1.3 GPa. The results of UV exposure are provided in Table XII.

Table XII shows that the dielectric constant increases dramatically with exposure time for both dense OSG films deposited from DEMS or for 3MS films. However, the dielectric constant for the 3MS film remained relatively constant after 600 seconds of exposure to UV light in a vacuum atmosphere.

TABLE XII

Change in film properties for dense OSG films when exposed to UV light under air.

| Film | Time (seconds) | Atmosphere | Refractive Index | Dielectric Constant | Thickness Loss (%) |
|---|---|---|---|---|---|
| DEMS | 0 | N/A | 1.429 | 2.75 | N/A |
| DEMS | 300 | Air | 1.421 | 3.30 | 0 |
| DEMS | 600 | " | 1.423 | 3.39 | 0 |
| DEMS | 1200 | " | 1.419 | 3.65 | 0 |
| 3MS | 0 | N/A | 1.445 | 2.95 | N/A |
| 3MS | 300 | Air | 1.441 | 3.65 | 0 |
| 3MS | 600 | " | 1.448 | 3.90 | 0 |
| 3MS | 1200 | " | 1.435 | 4.45 | 0 |
| 3MS | 600 | Vacuum | 1.439 | 2.98 | 0 |

TABLE XIII

Change in film properties for porous OSG films when exposed to UV light under air.

| Film | Time (seconds) | Atmosphere | Refractive Index | Dielectric Constant | Thickness Loss (%) |
|---|---|---|---|---|---|
| DEMS + ATRP | 0 | N/A | 1.495 | 2.86 | N/A |
| DEMS + ATRP | 300 | Air | 1.525 | 4.79 | −13 |

Example 20

Compositional Uniformity of the DEMS/ATRP OSG Films

Exemplary porous OSG films were formed onto a silicon wafer via PE-CVD of 210 mg/min of the structure-former precursor DEMS, 490 mg/min of the pore-former precursor ATRP, with 200 sccm of a $CO_2$ carrier gas and 25 sccm of oxygen. The deposition was performed at 8 torr, 750 W plasma power, 350 mils spacing, and a liquid flow of 675 mg/min. The wafer temperature during deposition was maintained at 300° C. The deposition rate of the film was 460 nm/minute.

Dynamic SIMS depth of profile analysis of the OSG films, as deposited and after exposure to a UV light source at 1 minute and at 15 minutes, was conducted using an cesium ion gun at 2.5 kev to determine the compositional non-uniformity of the silicon, oxygen, carbon, and hydrogen within each film through detection of negative species at various points throughout the thickness of the film. The dynamic SIMS data is provided in FIGS. 11a through 11c. The thickness of the as-deposited film, the film exposed to UV light for 1 minute, and the film exposed to UV light for 15 minutes was 1 micron, 980 nm, and 890 nm, respectively. The percentage of compositional non-uniformity for the OSG film after deposition, after exposure to UV light for 1 minute, and after exposure to UV light after 15 minutes is provided in FIGS. 11a through 11c.

Figure 11A:
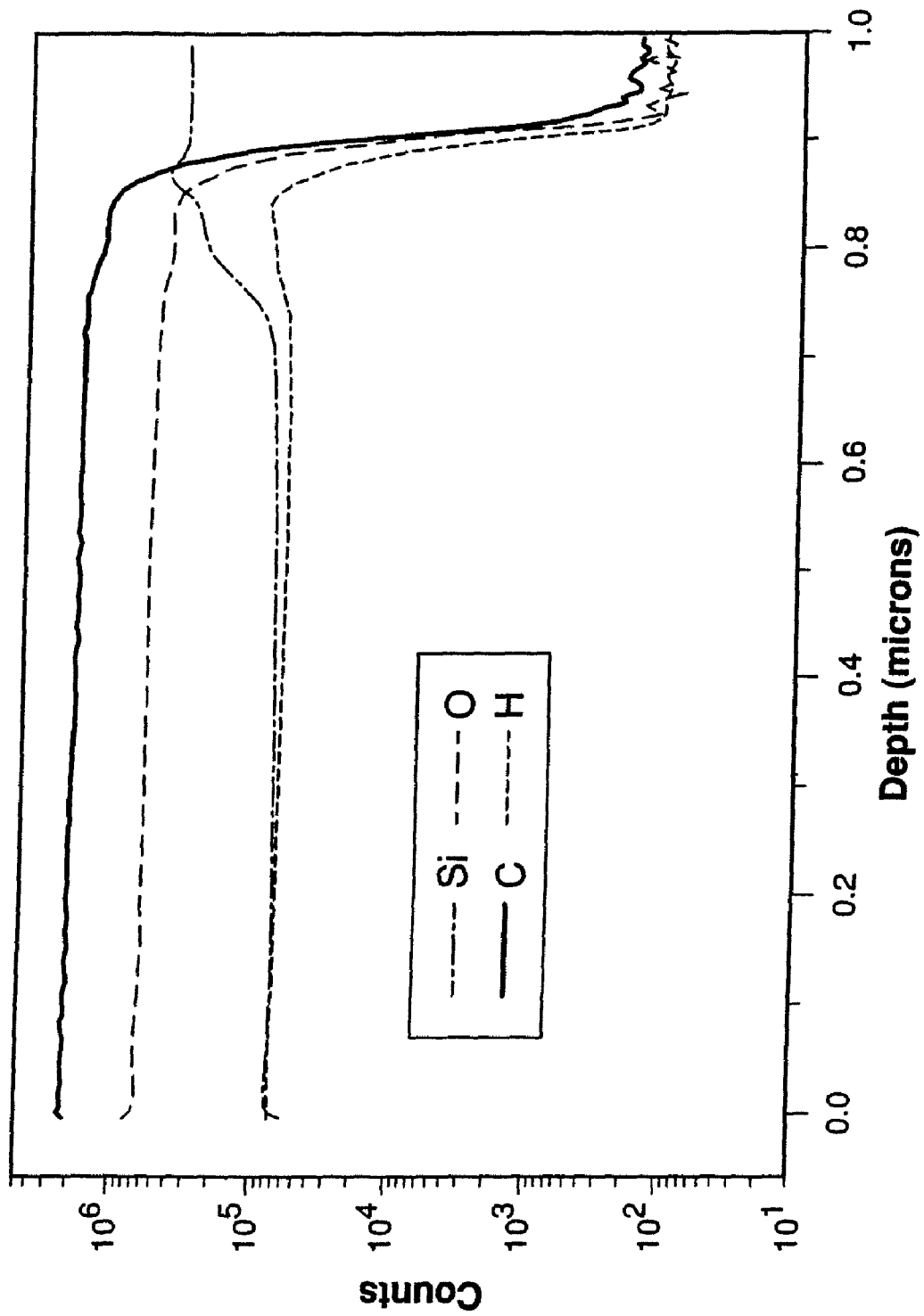
FIGS. 11a, 11b, and 11c provide the dynamic SIMS depth of profile measurements of silicon, oxygen, hydrogen, and carbon for a porous OSG film deposited using a DEMS structure-former precursor and an ATRP pore-former precursor after deposition and after exposure to UV light in a vacuum atmosphere for 1 minute and 15 minutes, respectively.
Figure 11B:
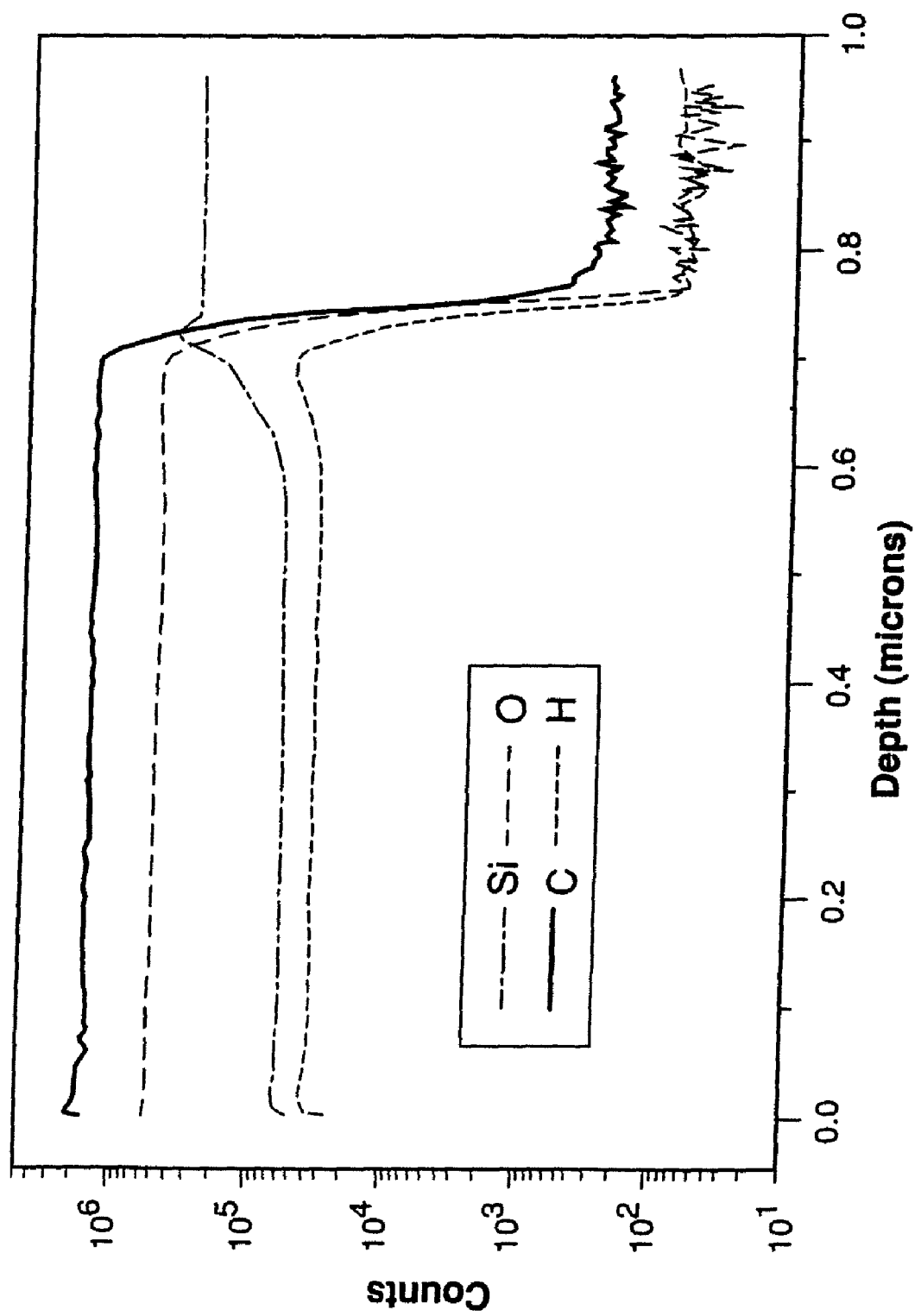
Figure 11C:
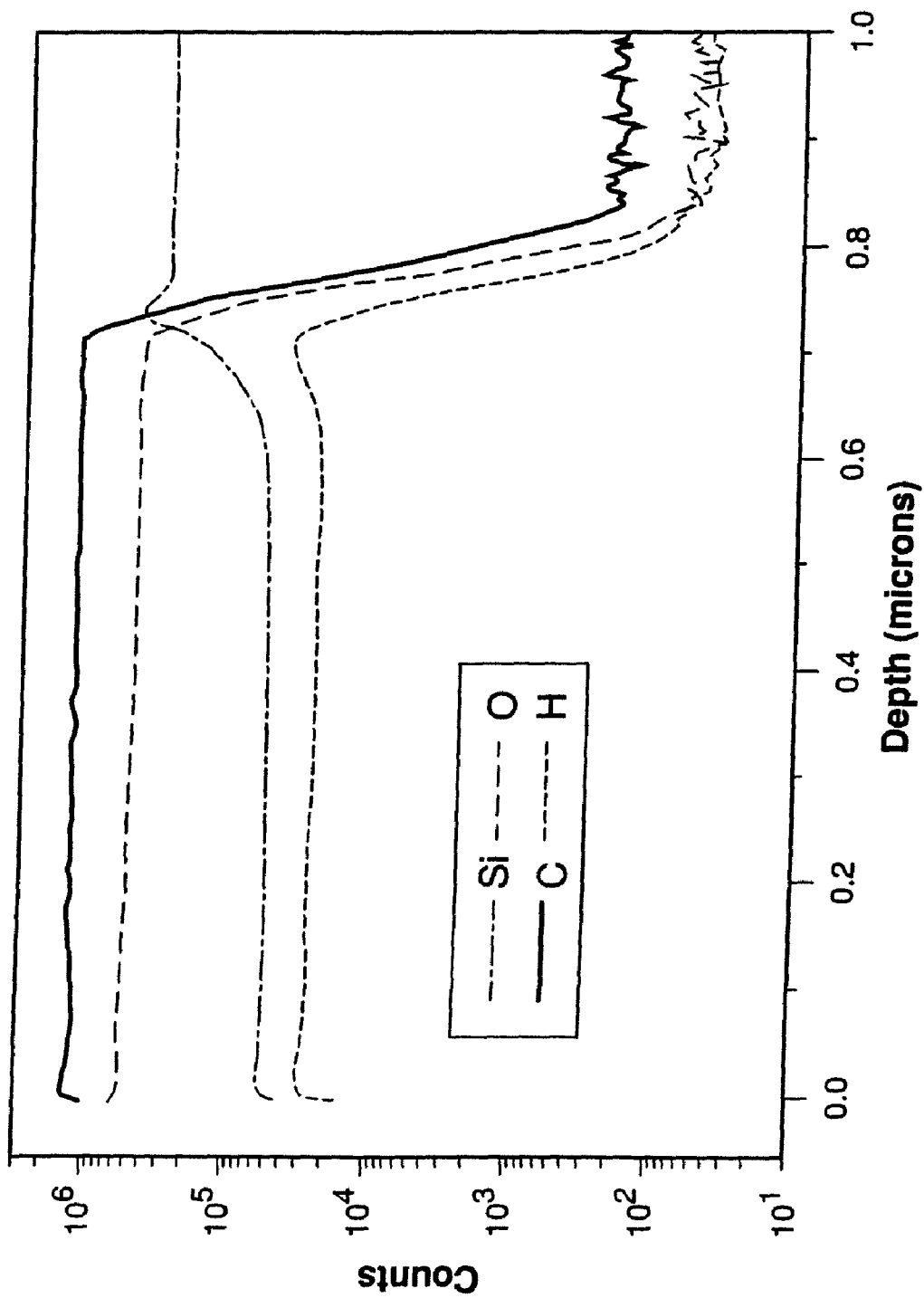

Table XIV shows that the percentage of compositional non-uniformity as calculated using the standard deviation for a variety of different SIMS measurements taken throughout each film. As FIGS. 11a through 11c illustrate, the substantially flat profiles of the silicon, oxygen, carbon, and hydrogen elements contained therein show that the composition is substantially uniform throughout the thickness of the film. The upward spike in the data at the bottom of the film was attributable to interfacial effects.

TABLE XIV

Percentage of Compositional Non-Uniformity

| % Uniformity | H | C | O | Si |
|---|---|---|---|---|
| As-deposited | 3.5064 | 3.2662 | 6.2764 | 1.6829 |
| After 1 min. UV | 1.1669 | 0.8641 | 1.2081 | 1.1438 |
| After 15 min. UV | 0.9569 | 0.7892 | 0.7610 | 1.0811 |

Example 21

Deposition of Octamethylcyclotetrasiloxane (OMCTS) Film

OSG films deposited from plasma enhanced chemical vapor deposition (PE-CVD) of octamethylcyclotetrasiloxane (OMCTS) were exposed to UV light for varying amounts of time. The dielectric constant of the film before UV treatment was nominally 3.0. The change in modulus and hardness of the film after UV exposure are provided in Table XV. The data shows that UV exposure of an OMCTS film deposited by PE-CVD improves its material hardness by 83% after exposure and treatment with UV light compared to that of the as-deposited film.

TABLE XV

Film properties after exposure to UV light for the time durations shown.

| UV Exposure Time (minutes) | Thickness (nm) | Thickness Loss (%) | Dielectric Constant | Modulus (GPa) | Hardness (GPa) |
|---|---|---|---|---|---|
| 0 | 930 | — | 3.0 | 13.8 | 2.3 |
| 1 | 920 | −1 | N/A | 15.4 | 2.6 |
| 5 | 870 | −6.5 | N/A | 22.0 | 3.4 |
| 10 | 860 | −7.5 | N/A | 24.6 | 3.5 |
| 15 | 850 | −8.6 | N/A | 24.4 | 3.5 |
| 30 | 820 | −11.8 | N/A | 31.3 | 4.1 |

The present invention has been set forth with regard to several preferred embodiments, but the scope of the present invention is considered to be broader than those embodiments and should be ascertained from the claims below.

The invention claimed is:

1. A process for improving a material hardness and an elastic modulus of an organosilicate film, the process comprising:
    depositing the organosilicate film onto at least a portion of a substrate via chemical vapor deposition of an at least one chemical reagent comprising a structure-former precursor to provide the organosilicate film having a first material hardness and a first elastic modulus wherein the depositing step involves one or more processes selected from the group consisting of thermal chemical vapor deposition, plasma enhanced chemical vapor deposition, cryogenic chemical vapor deposition, chemical assisted vapor deposition, hot-filament chemical vapor deposition, photo-initiated chemical vapor deposition, and combinations thereof; and
    exposing the organosilicate film to an ultraviolet radiation source within a non-oxidizing atmosphere to provide the organosilicate film having a second material hardness and a second elastic modulus wherein the second material hardness and the second elastic modulus are at least 10% higher than the first material hardness and the first elastic modulus.

2. The process of claim 1 further comprising treating the organosilicate film with at least one energy source.

3. The process of claim 2 wherein the treating step occurs during at least a portion of the exposing step.

4. The process of claim 2 wherein the at least one energy source heats the organosilicate film to a temperature between 25 to 450° C.

5. The process of claim 1 wherein the temperature of the organosilicate film during the depositing step ranges from 25 to 450° C.

6. The process of claim 5 wherein the temperature of the organosilicate film during the depositing step ranges from 250 to 450° C.

7. The process of claim 1 wherein the forming step is plasma enhanced chemical vapor deposition.

8. The process of claim 1 wherein the ultraviolet light has one or more wavelengths of about 400 nm or below.

9. The process of claim 1 wherein the ultraviolet light has one or more wavelengths of about 300 nm or below.

10. The process of claim 1 wherein the ultraviolet light has one or more wavelengths of about 200 nm or below.

11. The process of claim 1 wherein the non-oxidizing atmosphere contains at least one gas selected from the group consisting of nitrogen, hydrogen, carbon monoxide, carbon dioxide, helium, argon, neon, krypton, xenon, radon, and combinations thereof.

12. The process of claim 1 wherein the non-oxidizing atmosphere comprises a vacuum.

13. The process of claim 12 wherein the pressure ranges from 0.005 millitorr to 5000 torr.

14. The process of claim 1 wherein the at least one chemical reagent further comprises a pore-former precursor.

15. The process of claim 14 wherein the dielectric constant of the organosilicate film after the exposing step is at least 5% less than the dielectric constant of the organosilicate film before the exposing step.

16. The organosilicate film prepared by the process of claim 1.

17. The organosilicate film of claim 16 having a compositional non-uniformity of about 10% or less.

18. A process for improving a material hardness and an elastic modulus of a porous organosilicate film deposited by chemical vapor deposition represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic %, and z is from 0 to 15 atomic %, the method comprising:
    providing a substrate within a vacuum chamber;
    introducing at least one chemical reagent comprising a structure-former precursor selected from the group consisting of an organosilane and an organosiloxane and a pore-former precursor into the vacuum chamber;
    applying energy to the at least one chemical reagent in the vacuum chamber to induce reaction of the reagent to deposit a composite film comprised of a pore-former material and a structure-former material on at least a portion of the substrate; and exposing the composite film to an ultraviolet light source within a non-oxidizing atmosphere to provide a porous organosilicate film wherein the material hardness and the elastic modulus of the porous organosilicate film after the exposing step are higher than the material hardness and the elastic modulus of the composite film before the exposing step and wherein the porous organosilicate film is substantially free of Si—OH bonds,
    wherein the pore-former precursor and the structure-former precursor are the same compound.

19. A process for improving a material hardness and an elastic modulus of a porous organosilicate film deposited by chemical vapor deposition represented by the formula $Si_vO_wC_xH_yF_z$, where v+w+x+y+z=100%, v is from 10 to 35 atomic %, w is from 10 to 65 atomic %, x is from 5 to 30 atomic %, y is from 10 to 50 atomic %, and z is from 0 to 15 atomic %, the method comprising:
    providing a substrate within a vacuum chamber;
    introducing at least one chemical reagent comprising a structure-former precursor selected from the group consisting of an organosilane and an organosiloxane and a pore-former precursor into the vacuum chamber;

applying energy to the at least one chemical reagent in the vacuum chamber to induce reaction of the reagent to deposit a composite film comprised of a pore-former material and a structure-former material on at least a portion of the substrate; and exposing the composite film to an ultraviolet light source within a non-oxidizing atmosphere to provide a porous organosilicate film wherein the material hardness and the elastic modulus of the porous organosilicate film after the exposing step are higher than the material hardness and the elastic modulus of the composite film before the exposing step and wherein the porous organosilicate film is substantially free of Si—OH bonds, wherein the pore-former precursor and the structure-former precursor are the same compound, which is at least one member selected from the group consisting of: 1-neohexyl-1,3,5,7-tetramethyl-cyclotetrasiloxane, di-neohexyl-diethoxysilane, 1,4-bis(diethoxysilyl)cylcohexane, and combinations thereof.

* * * * *